(12) United States Patent
Ono

(10) Patent No.: US 6,495,067 B1
(45) Date of Patent: Dec. 17, 2002

(54) LIQUID CRYSTAL COMPOUND, LIQUID CRYSTAL MIXTURE OR COMPOSITION, ELECTROLYTE COMPRISING THE SAME, ELECTROCHEMICAL CELL AND PHOTO-ELECTROCHEMICAL CELL CONTAINING THE ELECTROLYTE

(75) Inventor: Michio Ono, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/516,628

(22) Filed: Mar. 1, 2000

(30) Foreign Application Priority Data

Mar. 1, 1999 (JP) .......................... 11-053162
Mar. 3, 1999 (JP) .......................... 11-055636

(51) Int. Cl.[7] .................. C09K 19/34; C09K 19/58; H01G 9/00; H01L 31/0256; H01M 6/16; C07D 213/20; C07D 233/58

(52) U.S. Cl. ............... 252/299.61; 252/299.2; 252/299.3; 252/62.2; 136/263; 429/328; 546/347; 548/335.1

(58) Field of Search .......................... 252/299.1, 299.2, 252/299.5, 299.3, 299.01, 62.2; 136/263; 429/328; 546/347; 548/335.1

(56) References Cited

U.S. PATENT DOCUMENTS

| | | | | |
|---|---|---|---|---|
| 4,801,713 A | * | 1/1989 | Kawabata et al. | 546/151 |
| 5,084,365 A | * | 1/1992 | Gratzel | 429/111 |
| 5,091,274 A | * | 2/1992 | Hsiue et al. | 429/192 |
| 6,096,392 A | * | 8/2000 | Nishio | 428/1.1 |
| 6,171,522 B1 | * | 1/2001 | Michot et al. | 252/500 |
| 6,376,765 B1 | * | 4/2002 | Wariishi et al. | 136/263 |
| 6,384,321 B1 | * | 5/2002 | Mikoshiba et al. | 136/263 |

FOREIGN PATENT DOCUMENTS

JP 10-53585 * 2/1998

OTHER PUBLICATIONS

Caplus 1980:503744.*
Japanese Patent Application No. Hei. 9–113570 (filed Apr. 16, 1997), JP–A–1053585 (published Feb. 24, 1998).
STN International, American Chemical Society, 1999, RN 150697–81–7, p. 12.
STN International, American Chemical Society, 1999, RN 72668–04–3, p. 303.

* cited by examiner

*Primary Examiner*—Shean C. Wu
(74) *Attorney, Agent, or Firm*—Birch, Stewart, Kolasch & Birch, LLP

(57) ABSTRACT

A liquid crystal compound, preferably a molten iodine salt, an electrolyte comprising the same, and a photo-electrochemical cell are disclosed. The electrolyte is little volatile and excellent in charge transporting performance and provides a photo-electrochemical cell which exhibits high photoelectric conversion efficiency and excellent durability.

22 Claims, 1 Drawing Sheet

LIQUID CRYSTAL COMPOUND, LIQUID CRYSTAL MIXTURE OR COMPOSITION, ELECTROLYTE COMPRISING THE SAME, ELECTROCHEMICAL CELL AND PHOTO-ELECTROCHEMICAL CELL CONTAINING THE ELECTROLYTE

FIELD OF THE INVENTION

This invention relates to a novel liquid crystal compound which is specially useful as an electrolyte, a mixture or composition containing the compound, an electrolyte comprising a liquid crystal compound including the novel compound, and an electrochemical cell using the electrolyte, particularly a photo-electrochemical cell.

BACKGROUND OF THE INVENTION

The electrolyte used in an electrochemical cell, such as a lithium ion secondary battery or a solar cell having a dye-sensitized semiconductor layer, is a medium which contains ions meeting the purpose and functions as an ion conductor transporting the ions between electrodes. A solution type electrolyte (i.e., electrolytic solution) has been of general use because of its high ion conductivity but is disadvantageous in that the solvent tends to evaporate or the solution tends to leak while used in a battery, causing reduction of battery life. Further, a metallic container should be used to seal in the electrolytic solution, which increases the weight of the battery and narrows the freedom of design.

In order to overcome the disadvantages of a solution type electrolyte, various types of electrolytes have recently been proposed. Although a gel electrolyte comprising a polymer matrix impregnated with an electrolytic solution, not being so inferior in ion conductivity, offers a level of battery performance equal to that of a solution type electrolyte, it cannot completely avoid evaporation of the solvent. A polymer electrolyte comprising a polymer, such as polyethylene oxide, having a salt dissolved therein is expected to settle the problems associated with a solution type electrolyte but has not attained sufficient ion conductivity. A molten salt, which is liquid at room temperature, such as an imidazolium or pyridinium salt having $BF_4^-$, $(CF_3SO_2)_2N^-$, etc. as a counter anion, has been suggested as an electrolyte of lithium ion batteries. However, mechanical strength and ion conductivity of an electrolyte conflict with each other. When the mechanical strength of the molten salt electrolyte is enhanced by increasing the viscosity of the molten salt itself or by incorporating a polymer, a reduction in ion conductivity results. Further, these state-of-the-art electrolytes show large temperature dependence of ion conductivity, and, in particular, their ion conductivity is insufficient at low temperature.

On the other hand, study of photovoltaic power generation (i.e., solar electricity generation) consisting in conversion of light energy to electrical energy has been directed chiefly to development of monocrystalline silicon solar cells, polycrystalline silicon solar cells, amorphous silicon solar cells, and compound solar cells using cadmium telluride, copper indium selenide, etc., and some of them have been put to practical use. It is required for spread of solar cells to overcome such difficulties as a high production cost, a short supply of raw materials, and a long energy payback time. Although many solar cells using organic materials have been proposed aiming at an increase of working area and a reduction of cost, they have a low conversion efficiency and poor durability.

Under these circumstances, Nature, vol. 353, pp. 737–740 (1991) and U.S. Pat. No. 4,927,721 disclosed a photoelectric conversion device using a dye-sensitized oxide semiconductor (hereinafter, called a dye-sensitized photoelectric conversion device) and a photo-electrochemical cell comprising the device. The disclosed cell comprises a photoelectric conversion device functioning as a work electrode (negative electrode), a charge transporting layer, and a counter electrode (positive electrode). The photoelectric conversion device comprises an electrically conductive substrate and a photosensitive layer containing a semiconductor having a dye adsorbed on the surface thereof. The charge transporting layer comprises a redox system and serves for charge transport between the negative electrode and the positive electrode. The photo-electrochemical cell proposed in the above U.S. Patent is of wet type using, as a charge transporting layer, an aqueous electrolytic solution containing such a salt as potassium iodide. This system is promising in that a relatively high energy conversion efficiency (i.e., photoelectric conversion efficiency) can be reached for its low price. The outstanding problem of conventional dye-sensitized photoelectric conversion devices is that the cell will be short of the electrolytic solution due to evaporation in long-term use only to have a seriously deteriorated photoelectric conversion efficiency or fail to function as a cell.

To solve this problem, WO95/18456 teaches use of an imidazolium salt that is a low-melting compound as an electrolyte so as to prevent a shortage of an electrolytic solution. According to this method, water or an organic solvent that has been used as a solvent for an electrolyte is not necessary at all or used in a reduced amount so that improvement in durability can result. However, the durability is still insufficient and, besides, an increase in concentration of the imidazolium salt is accompanied by a reduction of photoelectric conversion efficiency. Use of a triazolium salt as an electrolyte has also been proposed, which has the same problems as the imidazolium salt.

SUMMARY OF THE INVENTION

An object of the present invention is to provide a novel liquid crystal compound and a mixture or composition containing the same which are specially useful as a material of an electrolyte for an electrochemical cell.

Another object of the present invention is to provide an electrolyte having high electrical conductivity and durability which is specially suited for use in a photo-electrochemical cell.

Still another object of the present invention is to provide an electrochemical cell having excellent durability, particularly a photo-electrochemical cell excellent in photoelectric conversion efficiency and durability.

The above objects of the present invention are accomplished by:

(1) A liquid crystal compound represented by formula (I-1) or (I-2):

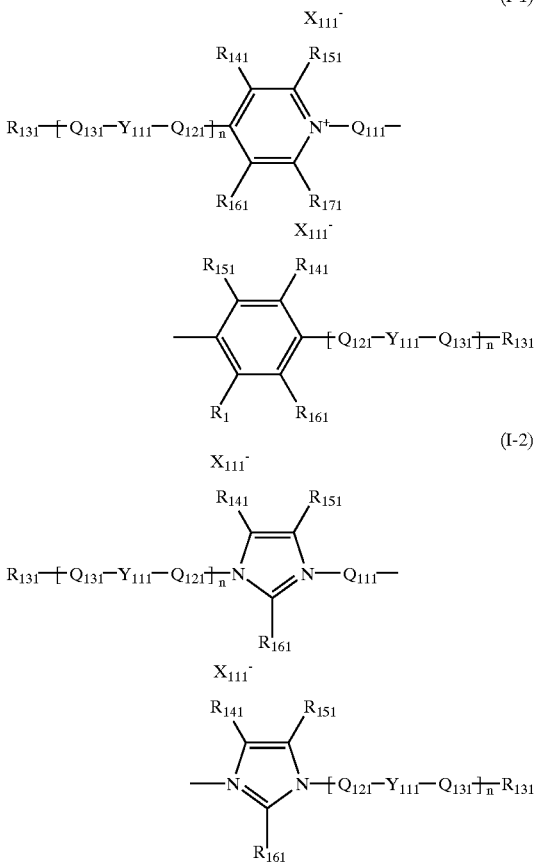

wherein $Q_{111}$ represents a divalent linking group with the proviso that $Q_{111}$ does not represent a polymethylene group nor a phenylenebis(poly)methylene group without containing a hetero atom; $X_{111}^-$ represents an anion; $R_{141}$, $R_{151}$, $R_{161}$, and $R_{171}$ each represent a hydrogen atom or a substituent; $R_{131}$ represents a substituted or unsubstituted alkyl group or a substituted or unsubstituted alkenyl group; $Y_{111}$ represents a divalent 4-, 5-, 6- or 7-membered ring or a divalent condensed ring composed of 4-, 5-, 6- or 7-membered rings; $Q_{121}$ and $Q_{131}$ each represent a divalent linking group or a single bond; n represents 1, 2 or 3; when n is 2 or 3, the plural $Y_{111}$'s $Q_{121}$'s, and $Q_{131}$'s may be the same or different.

(2) A liquid crystal mixture comprising at least two liquid crystal compounds represented by formula (I-1) or (I-2).

(3) A liquid crystal composition comprising at least one liquid crystal compound represented by formula (I-1) or (I-2) and at least one compound selected from an alkali metal salt and an alkaline earth metal salt.

(4) An electrolyte containing at least one liquid crystal compound represented by formula (IA):

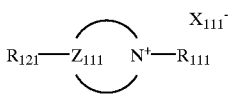

(IA)

wherein $R_{111}$ represents a substituted or unsubstituted alkyl or alkenyl group which is bonded to the nitrogen atom either directly or via a divalent linking group; $Z_{111}$ represents an atomic group necessary to form a 5- or 6-membered aromatic heterocyclic cation together with the nitrogen atom; $R_{121}$ represents a substituent serving to exhibit liquid crystal properties which contains at least one divalent cyclic linking group and at least one substituted or unsubstituted alkyl or alkenyl group; and $X_{111}^-$ represents an anion, the compound represented by formula (IA) being preferably represented by formula (I-1) or (I-2).

(5) An electrochemical cell having the above-described electrolyte, particularly a photo-electrochemical cell comprising a semiconductor responsive to a radiant ray and a charge transporting layer containing the above-described electrolyte.

According to the present invention, an electrolyte which is substantially nonvolatile and excellent in charge transporting performance can be provided. The electrolyte of the present invention provides a photo-electrochemical cell which exhibits excellent photoelectric conversion characteristics and undergoes little deterioration in performance with time.

DETAILED DESCRIPTION OF THE INVENTION

Figure 1:
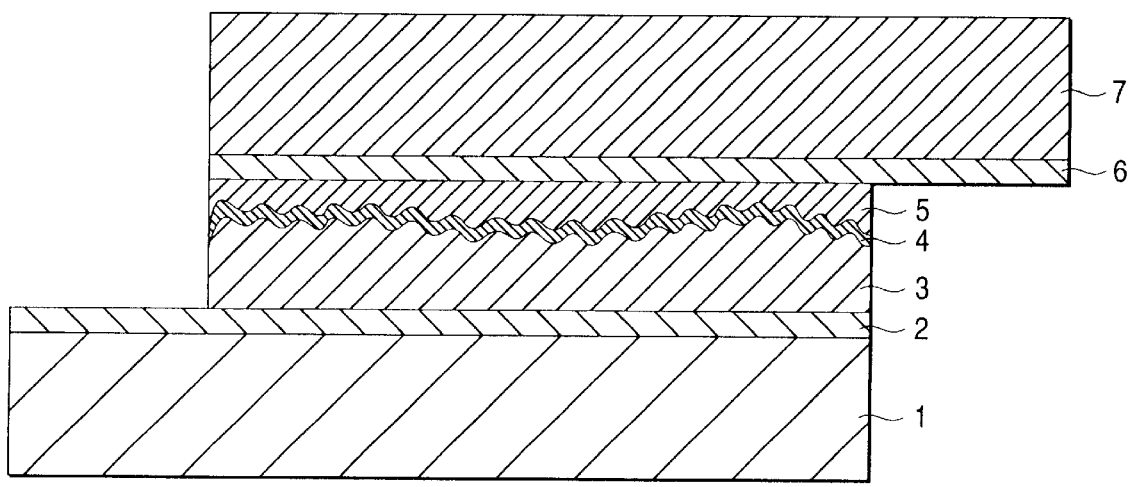
FIG. 1 is a schematic cross section of the photo-electrochemical cell prepared in Examples.

The electrolyte containing the ionic liquid crystal compound represented by formula (IA) (hereinafter the compound (IA)) is usable as a reaction solvent in chemical reactions, chemical plating, etc. and as an electrolyte of various batteries in CCD (charge coupled device) cameras and the like. It is especially useful in lithium secondary batteries and photo-electrochemical cells using a semiconductor and specially in photo-electrochemical cells.

The compound (IA), which will be described later in detail, is a liquid salt or a low-melting solid salt and is capable of forming a liquid crystal phase at room temperature (25° C.). A battery having a general electrolyte dissolved in a low-molecular solvent suffers from deterioration of performance on account of volatilization of the solvent or leakage of the solution. It is known to use a compound called a molten salt that is liquid at room temperature as an electrolyte. Having an extremely higher boiling point than general low-molecular solvents, the molten salt used as an electrolyte of a photo-electrochemical cell is effective in preventing deterioration of cell performance by volatilization. However, it has low charge transporting ability due to its high viscosity and fails to achieve sufficient photoelectric conversion efficiency in a photo-electrochemical cell. Compared with the electrolytes comprising the low-molecular solvent or the molten salt, the electrolyte comprising the liquid crystal molten salt of the present invention exhibits high charge transporting ability in its liquid crystal state while having a high viscosity and is prevented from reducing the cell performance. Having sufficient charge transporting ability, the electrolyte of the present invention shows high photoelectric conversion efficiency especially when applied to a photo-electrochemical cell.

The present invention will be described with particular reference to a photo-electrochemical cell, which is a practical and preferred application of a photoelectric device for use as a battery working in an external circuit. The photo-electrochemical cell of the present invention comprises a semiconductor responsive to a radiant ray, a charge transporting layer, and a counter electrode. The charge transporting layer contains the electrolyte according to the invention.

The photoelectric device used in the present invention comprises an electrically conductive substrate, a semiconductor film (i.e., a photosensitive layer), a charge transporting layer, and a counter layer. The photosensitive layer is designed in conformity with the intended use and may have either a single layer structure or a multilayer structure. It is preferred that the semiconductor film be sensitized with a dye. Light having entered the photosensitive layer excites the dye. The excited dye has high energy electrons, which are handed over from the dye to the conduction band of the semiconductor particles and diffused to reach the conductive substrate. Meanwhile the dye molecules are converted into an oxidized state. The electrons of the conductive substrate return to the oxidized dye through the counter electrode and the charge transporting layer thereby to regenerate the dye while working in the external circuit. The semiconductor film acts as a negative electrode of the cell. The layers constituting the device may be diffused and mixed mutually at their boundaries, for example, the boundary between the conductor layer (hereinafter described) of the conductive substrate and the photosensitive layer, the boundary between the photosensitive layer and the charge transporting layer, and the boundary between the charge transporting layer and the counter electrode. For example, the charge transporting layer does not need to be an independent layer with a distinct border. That is, a part or the whole of the electrolyte may penetrate into the particulate semiconductor layer to form a charge transporting layer.

The semiconductor serves as a photoreceptor that absorbs light to induce charge separation and to generate electrons and positive holes. In the dye-sensitized semiconductor, the task of light absorption and generation of electrons and positive holes is chiefly performed by the dye, and the semiconductor plays a role in accepting and transmitting the electrons.

The semiconductor which can be used in the present invention includes single body semiconductors, e.g., Si or Ge, compound semiconductors, such as metal chalcogenides (e.g., oxides, sulfides, and selenides), and perovskite semiconductors. Examples of the metal chalcogenides include an oxide of titanium, tin, zinc, iron, tungsten, zirconium, hafnium, strontium, indium, cerium, yttrium, lanthanum, vanadium, niobium or tantalum; a sulfide of cadmium, zinc, lead, silver, antimony or bismuth; a selenide of cadmium or lead; and cadmium telluride. Examples of the other compound semiconductors include a phosphide of zinc, gallium, indium or cadmium, gallium arsenide, copper indium selenide, and copper indium sulfide. Examples of the perovskite semiconductors include strontium titanate, calcium titanate, sodium titanate, barium titanate, and potassium niobate.

Examples of the preferred semiconductors for use in the present invention include Si, $TiO_2$, $SnO_2$, $Fe_2O_3$, $WO_3$, ZnO, $Nb_2O_5$, CdS, ZnS, PbS, $Bi_2S_3$, CdSe, CdTe, GaP, InP, GaAs, $CuInS_2$, and $CuInSe_2$. Still preferred are $TiO_2$, ZnO, $SnO_2$, $Fe_2O_3$, $WO_3$, $Nb_2O_5$, CdS, PbS, CdSe, InP, GaAs, $CuInS_2$, and $CuInSe_2$. $TiO_2$ and $Nb_2O_3$ are more preferred. $TiO_2$ is the most preferred.

The semiconductor may be a single crystal or polycrystalline. A single crystal is preferred for conversion efficiency, while a polycrystalline semiconductor is preferred from the standpoint of production cost, supply of raw materials, and an energy payback time. Finely particulate semiconductors having a particle size on the order of nanometers to microns are particularly preferred. The particulate semiconductors preferably have an average primary particle size of 5 to 200 nm, particularly 8 to 100 nm, in terms of a projected area diameter. The semiconductor particles in a dispersed state (secondary particles) preferably have an average particle size of 0.01 to 100 µm.

Semiconductor particles of two or more kinds having different sizes can be used as a mixture. In this case, the average size of smaller particles is preferably 5 nm or less. For the purpose of scattering incident light to improve the rate of capturing light, large semiconductor particles about 300 nm in size may be used in combination.

The particulate semiconductor is preferably prepared by a sol-gel process described, e.g., in Sumio Sakubana, *Sol-gel-ho no kagaku*, Agune Shofusha (1988) and Gijutsu Joho Kyokai, *Sol-gel-ho niyoru hakumaku coating gijutsu* (1995), and a gel-sol process described in Tadao Sugimoto, *Materia*, vol. 35, No. 9, pp. 1012–1018, "Shin goseiho gel-sol-ho niyoru tanbunsan ryushi no gosei to size keitai seigyo" (1996). The process for preparing an oxide developed by Degussa AG which comprises pyrogenically hydrolyzing a metal chloride in an oxyhydrogen flame is also preferred.

For preparation of titanium oxide particles, a sulfuric acid process and a chlorine process described in Manabu Seino, *Sanka titan busseito ohyogijutu*, Gihodo (1997) are also employable for preference in addition to the above-described sol-gel process, gel-sol process and pyrogenic flame hydrolysis.

Of the sol-gel processes for preparing titanium oxide particles, particularly preferred are the process described in Barbe et al., *Journal of Americal Ceramic Society*, vol. 80, No. 12, pp. 3157–3171 (1997) and the process described in Burnish et al., *Chemical Materials*, vol. 10, No. 9, pp. 2419–2425.

Examples of the electrically conductive substrate includes a substrate made of a conductive material, such as metal, and a substrate made of glass or plastics having on the surface thereof a conductor layer (i.e., a conductive layer). Examples of preferred conductors to be used in the latter conductive substrates include metals (e.g., platinum, gold, silver, copper, aluminum, rhodium, and indium), carbon, and electrically conductive metal oxides (e.g., indium tin composite oxide and F-doped tin oxide). The conductor layer preferably has a thickness of about 0.02 to 10 µm.

The conductive substrate preferably has as low a surface resistivity as possible. A desirable surface resistivity is 100 Ω/□ (square) or smaller, particularly 40 Ω/□ (square) or smaller. While not limiting, the practical minimal surface resistivity is about 0.1 Ω/□ (square).

It is desirable that the conductive substrate be substantially transparent to light. The term "substantially transparent" means that the light transmission is at least 10%, preferably 50% or more, still preferably 70% or more. A glass or plastic substrate having a conductive metal oxide layer is preferred as a transparent substrate. Of the above conductive substrates particularly preferred is conductive glass obtained by depositing F-doped tin dioxide on inexpensive soda-lime float glass. For the manufacture of inexpensive flexible photoelectric conversion devices or solar cells, a transparent polymer film having the above-described conductor layer is conveniently used. Examples of the useful transparent polymers include tetraacetylcellulose (TAC), polyethylene terephthalate (PET), polyethylene naphthalate (PEN), syndiotactic polystytrene (SPS), polyphenylene sulfide (PPS), polycarbonate (PC), polyacrylate (PAr), polysulfone (PSF), polyester sulfone (PES), polyether-imide (PEI), cyclic polyolefins, and brominated phenoxy resins. The amount of the conductive metal oxide to be applied is preferably 0.01 to 100 $g/m^2$ based on the support. The transparent conductive substrate is preferably used in such a manner that incident light enters from the side of the glass or plastic substrate.

In order to decrease the resistance of the transparent conductive substrate, it is preferred to use a metal lead, which is preferably made of aluminum, copper, silver, gold, platinum, nickel, etc., with an aluminum lead or a silver lead is particularly preferred. It is preferred that a metal lead be provided on the transparent substrate by vacuum evaporation, sputtering or a like deposition technique, on which a transparent conductor layer of F-doped tin oxide or ITO is provided. It is also preferred that the transparent conductor layer be provided on the transparent substrate, and then the metal lead can be formed. Reduction in incident light quantity due to the metal lead is usually 1 to 10%, preferably 1 to 5%.

The semiconductor particles are applied to the conductive substrate by, for example, a method comprising coating the conductive substrate with a dispersion or colloidal solution of the particulate semiconductor particles or the aforementioned sol-gel process and the like. Film formation in a wet system is relatively advantageous, taking into consideration suitability to mass production of a photoelectric conversion device, liquid physical properties, and adaptability to various substrates. Film formation in a wet system is typically carried out by coating or printing.

A dispersion of the semiconductor particles is prepared by the above-mentioned sol-gel process, a method comprising grinding a semiconductor in a mortar, or a method comprising wet grinding a semiconductor in a mill. A synthetic semiconductor as precipitated in a solvent in the form of fine particles can also be used as such. Examples of useful dispersing media include water and various organic solvents, such as methanol, ethanol, isopropyl alcohol, dichloromethane, acetone, acetonitrile, and ethyl acetate. If desired, a polymer, a surface active agent, an acid, a chelating agent, and the like may be added as a dispersing aid in preparing a dispersion.

Examples of wet coating techniques include application methods such as roll coating and dip coating, metering methods such as air knife coating or blade coating, and application methods combined with metering such as wire bar coating (JP-B-58-4589), slide hopper coating (U.S. Pat. Nos. 2,681,294, 2,761,419, and 2,761,791), extrusion coating, and curtain coating. General-purpose spin coating or spraying techniques are also suitable. Examples of the wet printing techniques include letterpress printing, offset printing, gravure printing, itaglio printing, rubber plate printing, and screen printing. A suitable film formation system is chosen from among the above-enumerated techniques in accordance with the liquid viscosity and a desired wet thickness.

The liquid viscosity is largely dependent on the kind and the dispersibility of the semiconductor particles, the solvent, and additives such as a surface active agent and a binder. In order to form a uniform film, extrusion coating or casting is fit for a high viscous liquid (e.g., 0.01 to 500 Poise), while slide hopper coating, wire bar coating or spin coating is suited for a low viscous liquid (e.g., 0.1 Poise or lower). A low viscous liquid could be applied by extrusion coating where it is to be applied to some coating weight. Screen printing, as is often used in applying a high-viscosity paste of semiconductor particles, can be used as well. Thus, a suitable wet process for film formation can be selected in accordance with such parameters as the liquid viscosity, the coating weight, the type of the substrate, the speed of application, and so forth.

The semiconductor layer does not need to be a single layer. Two or more layers different in particle size of semiconductor particles, in kind of semiconductors or in composition as for the binder or additives can be provided. In case where single operation of application is insufficient for giving a desired thickness, multilayer coating is effective. Extrusion coating or slide hopper coating is fit for multilayer coating. Multilayer coating can be carried out simultaneously or by successively repeating coating operation several to more than ten times. Screen printing is preferably applicable to successive multilayer coating.

In general, as the thickness of the particulate semiconductor layer increases, the amount of the dye held per unit projected area increases to show an increased rate of capturing light, but the distance of diffusion of generated electrons also increases, which results in an increased loss due to re-coupling of charges. Accordingly, there is a favorable thickness range for the particulate semiconductor layer, which is typically from 0.1 to 100 $\mu$m. Where the device is used as a photo-electrochemical cell, a more favorable thickness is 1 to 30 $\mu$m, particularly 2 to 25 $\mu$m. The coating weight of the semiconductor particles is preferably 0.5 to 400 g/m$^2$, still preferably 5 to 100 g/m$^2$.

It is preferred that the semiconductor particles applied to the substrate be heated to bring them into electronic contact with each other, to improve film strength, and to improve adhesion to the substrate. A preferred heating temperature is 40° C. or higher and lower than 700° C., particularly from 100 to 600° C. The heating time is usually from 10 minutes to about 10 hours. Where a substrate having a low melting point or a low softening point, such as a polymer film, is used, high-temperature treatment which would deteriorate the substrate should be avoided. For the economical consideration, too, the heating temperature is preferably as low as possible. The heating temperature can be lowered by using the above-mentioned small semiconductor particles having a diameter of up to 5 nm in combination or by conducting the heat treatment in the presence of a mineral acid.

For the purpose of increasing the surface area of the semiconductor particles and of increasing the purity in the vicinities of the semiconductor particles thereby to improve electron injection efficiency from the dye to the semiconductor particles, the heat-treated particulate semiconductor layer can be subjected to chemical plating with a titanium tetrachloride aqueous solution or electrochemical plating with a titanium trichloride aqueous solution.

It is preferable for the semiconductor particles to have a large surface area so that they may adsorb as large an amount of a dye as possible. The surface area of the semiconductor particles in the state applied to the conductive substrate is preferably 10 times or more, still preferably 100 times or more, the projected area. The practical upper limit of the surface area is, while not limited, about 1000 times the projected area.

Examples of the dyes which can be used in the present invention preferably include metal complex dyes and polymethine dyes. Two or more kinds of dyes may be used in combination so as to broaden the wavelength region of photoelectric conversion and to increase the conversion efficiency. The kinds and ratio of the dyes to be combined can be selected in conformity with the wavelength region and the intensity distribution of a light source to be used. It is preferred for the dyes to have an appropriate interlocking group for linking to the surface of the semiconductor particles. Examples of preferred interlocking groups include —COOH, —SO₃H, a cyano group, —P(O)(OH)₂, —OP(O)(OH)₂, and chelating groups having pi conductivity, such as oxime, dioxime, hydroxyquinoline, salicylate and α-keto-enolate groups. Particularly preferred of them are —COOH, —P(O)(OH)₂, and —OP(O)(OH)₂. The interlocking group may be in the form of a salt with an alkali metal, etc. or an intramolecular salt. Where the methine chain of a polymethine dye has an acidic group as in the case where the methine chain forms a squarylium ring or a croconium ring, that moiety can be used as a interlocking group.

The metal complex dyes of the present invention preferably include ruthenium complex dyes. Those represented by formula (IV) are still preferred.

$$(A_1)_pRuB_aB_bB_c \quad (IV)$$

wherein $A_1$ represents a ligand selected from the group consisting of Cl, SCN, H₂O, Br, I, CN, —NCO and SeCN; p represents an integer of 0 to 3, preferably 2; and $B_a$, $B_b$, and $B_c$ each represent an organic ligand selected from B-1 to B-8 shown below.

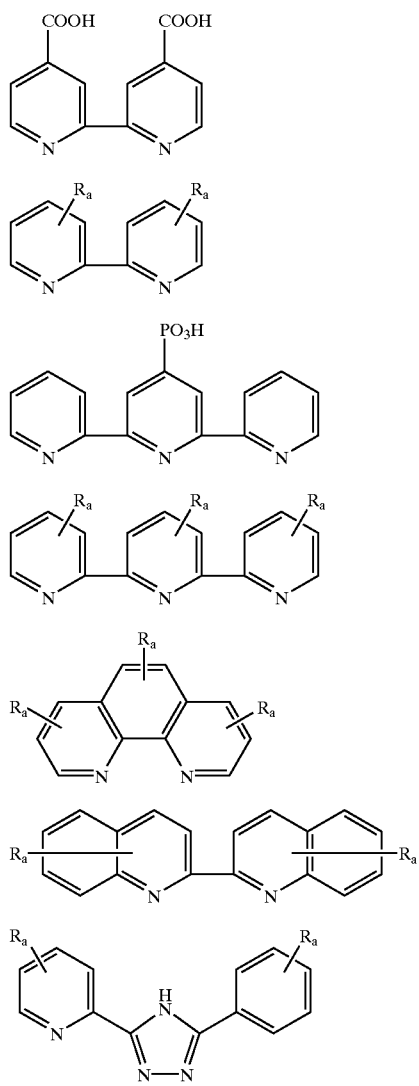

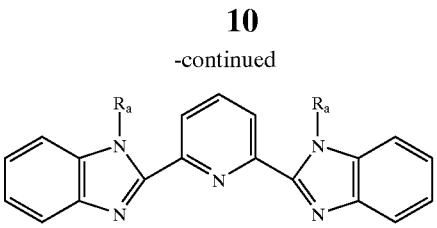

wherein $R_a$ represents a hydrogen atom, a halogen atom, a substituted or unsubstituted alkyl group having 1 to 12 carbon atoms, a substituted or unsubstituted aralkyl group having 7 to 12 carbon atoms or a substituted or unsubstituted aryl group having 6 to 12 carbon atoms. The alkyl group and the alkyl moiety of the aralkyl group may be either straight or branched, and the aryl group and the aryl moiety of the aralkyl group may be either monocyclic or polycyclic (condensed rings).

Examples of useful ruthenium complex dyes are given in U.S. Pat. Nos. 4,972,721, 4,684,537, 5,084,365, 5,350,644, 5,463,057, and 5,525,440 and JP-A-7-249790. Specific examples of preferred ruthenium complex dyes represented by formula (IV) are tabulated below.

| | | $(A_1)_pRUB_aB_bB_c$ | | | | |
|---|---|---|---|---|---|---|
| No. | $A_1$ | p | $B_a$ | $B_b$ | $B_c$ | $R_a$ |
| R-1 | SCN | 2 | B-1 | B-1 | — | — |
| R-2 | CN | 2 | B-1 | B-1 | — | — |
| R-3 | Cl | 2 | B-1 | B-1 | — | — |
| R-4 | Br | 2 | B-1 | B-1 | — | — |
| R-5 | I | 2 | B-1 | B-1 | — | — |
| R-6 | SCN | 2 | B-1 | B-2 | — | H |
| R-7 | SCN | 1 | B-1 | B-3 | — | — |
| R-8 | Cl | 1 | B-1 | B-4 | — | H |
| R-9 | I | 2 | B-1 | B-5 | — | H |
| R-10 | SCN | 2 | B-1 | B-6 | — | H |
| R-11 | CN | 2 | B-1 | B-7 | — | H |
| R-12 | Cl | 1 | B-1 | B-8 | — | H |
| R-13 | — | 0 | B-1 | B-1 | B-1 | — |

Specific examples of other suitable metal complex dyes are shown below.

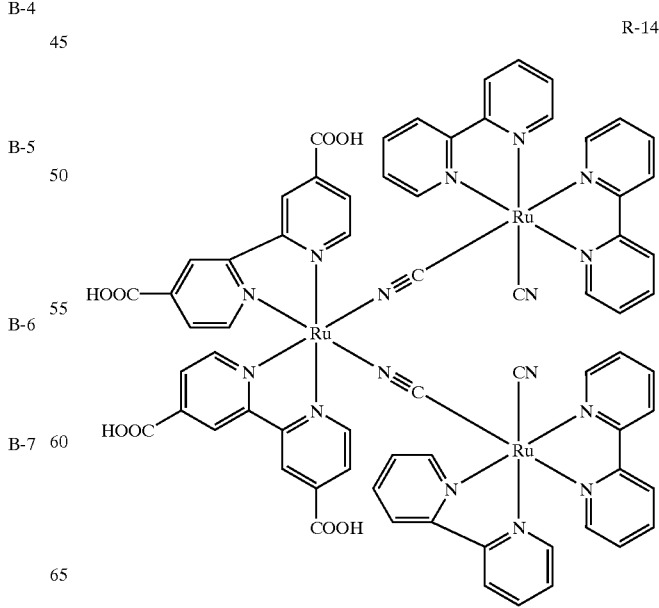

R-14

R-15

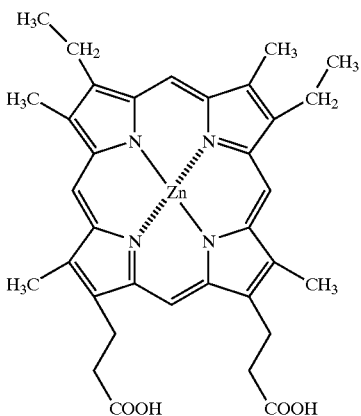

R-16

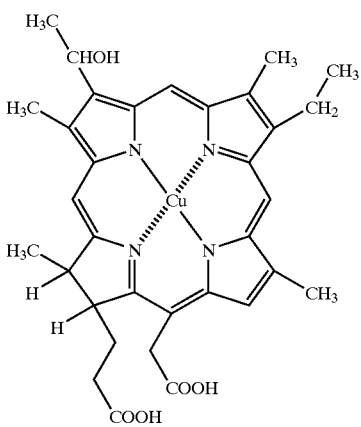

R-17

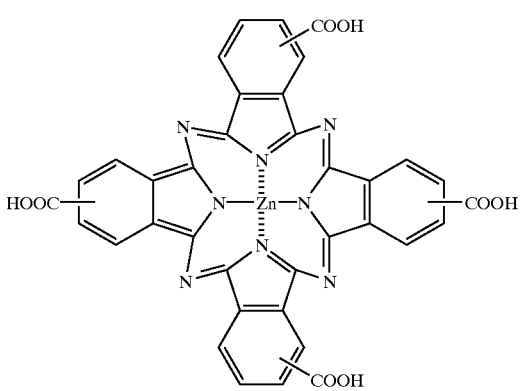

R-18

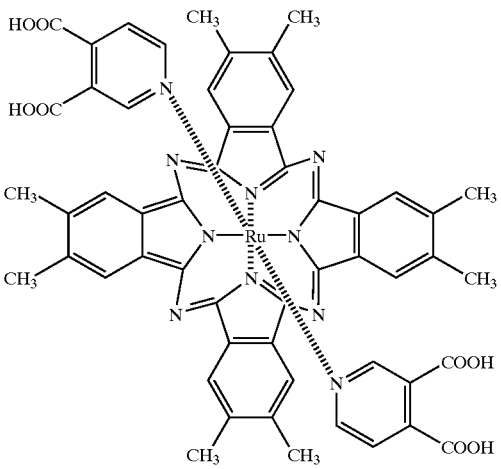

The polymethine dyes preferably include those represented by formulae (V) or (VI) shown below.

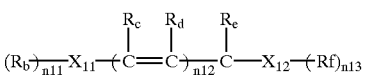

(V)

wherein $R_b$ and $R_f$ each represent a hydrogen atom, an alkyl group, an aryl group or a heterocyclic group; $R_c$, $R_d$, and $R_e$ each represent a hydrogen atom or a substituent; $R_b$, $R_c$, $R_d$, $R_e$, and $R_f$ may be bonded each other to form a ring; $X_{11}$ and $X_{12}$ each represent a nitrogen atom, an oxygen atom, a sulfur atom, a selenium atom or a tellurium atom; n11 and n13 each represent an integer of 0 to 2; and n12 represents an integer of 1 to 6.

The compound of formula (V) may have a counter ion in agreement with the charge quantity of the whole molecule. In formula (V), the alkyl, aryl, and heterocyclic groups may have a substituent; the alkyl group may be straight or branched; the aryl and heterocyclic groups may be monocyclic or polycyclic (condensed rings); and the ring formed of $R_b$, $R_c$, $R_d$, and $R_e$, and $R_f$ may have a substituent and may be monocyclic or polycyclic.

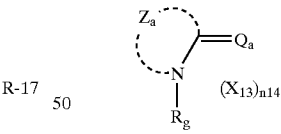

(VI)

wherein $Z_a$ represents a non-metallic atom group necessary to form a nitrogen-containing heterocyclic ring; $R_g$ represents an alkyl group or an aryl group; $Q_a$ represents a mono- or polymethine group necessary to complete a (poly)methine dye; $X_{13}$ represents a counter ion in balance; and n14 represents a number of from 0 up to 10 that is necessary to neutralize the charge of the molecule.

In formula (VI), the nitrogen-containing heterocyclic ring formed by $Z_a$ may have a substitutent and may be a single ring or a condensed ring; the alkyl or aryl groups may have a substituent; the alkyl group may be straight or branched; and the aryl group may be monocyclic or polycyclic (condensed rings).

Of the dyes represented by formula (VI) preferred are those represented by formulae (VI-a) through (VI-d):

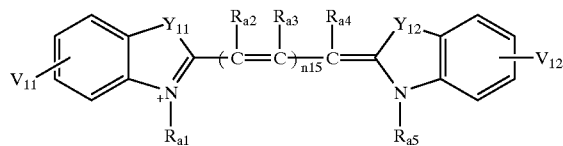

(VI-a)

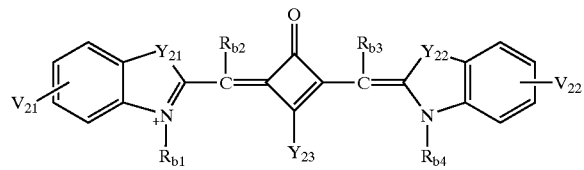

(VI-b)

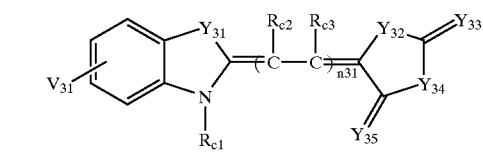

(VI-c)

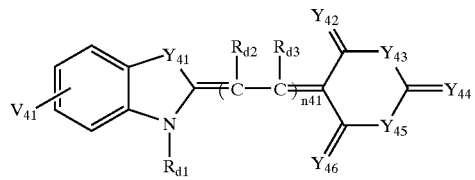

(VI-d)

wherein $R_{a1}$, $R_{a2}$, $R_{a3}$, $R_{a4}$, $R_{a5}$, $R_{b1}$, $R_{b2}$, $R_{b3}$, $R_{b4}$, $R_{c1}$, $R_{c2}$, $R_{c3}$, $R_{d1}$, $R_{d2}$, and $R_{d3}$ each represent a hydrogen atom, an alkyl group, an aryl group or a heterocyclic group; $Y_{11}$, $Y_{12}$, $Y_{21}$, $Y_{22}$, $Y_{31}$, $Y_{32}$, $Y_{33}$, $Y_{34}$, $Y_{35}$, $Y_{41}$, $Y_{42}$, $Y_{43}$, $Y_{44}$, $Y_{45}$, and $Y_{46}$ each represent an oxygen atom, a sulfur atom, a selenium atom, a tellurium atom, $-CR_{e1}R_{e2}-$ or $-NR_{e3}-$; $Y_{23}$ represents $O^-$, $S^-$, $Se^-$, $Te^-$ or $-NR_{e4}^-$; $R_{e1}$, $R_{e2}$, $R_{e3}$, and $R_{e4}$ each represent a hydrogen atom, an alkyl group, an aryl group or a heterocyclic group; $V_{11}$, $V_{12}$, $V_{21}$, $V_{22}$, $V_{31}$, and $V_{41}$ each represent a substituent; and n15, n31, and n41 each represent an integer of 1 to 6.

In formulae (VI-a) to (VI-d), the alkyl, aryl, and heterocyclic groups may have a substituent; the alkyl group may be straight or branched; and the aryl or heterocyclic group may be monocyclic or polycyclic (condensed rings).

Examples of the above-described polymethine dyes are described in detail in M. Okawara, T. Kitao, T. Hirashima, and M. Matuoka, *Organic Colorants*, Elsevier. Specific and preferred but non-limiting examples of the polymethine dyes represented by formula (V) or (VI) are listed below.

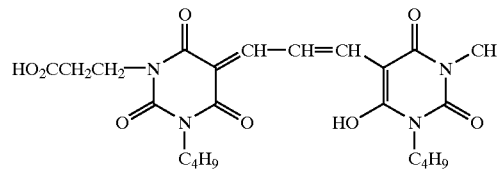

(1)

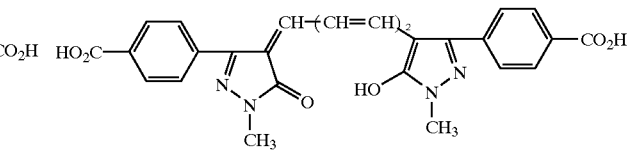

(2)

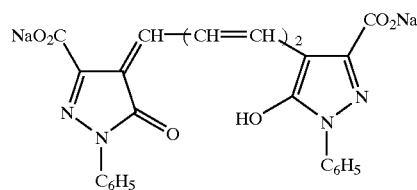

(3)

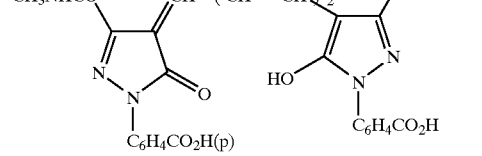

(4)

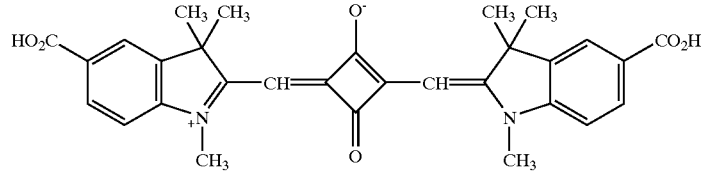

(5)

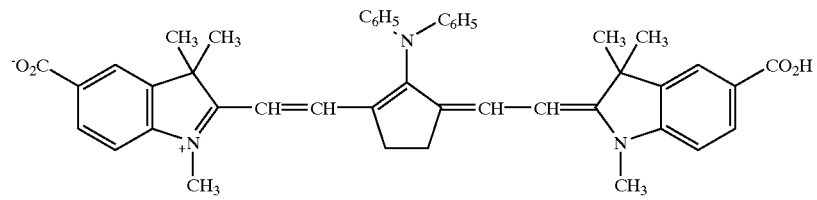

(6)

-continued
(7)
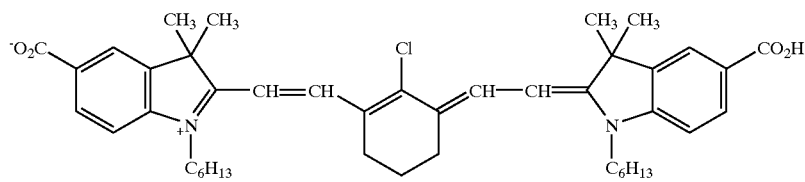
(8)
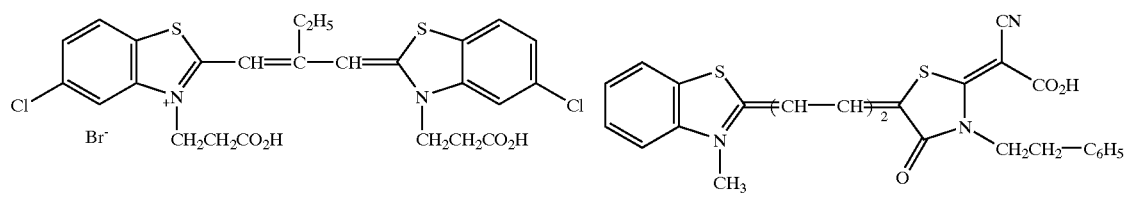
(9)
(10)
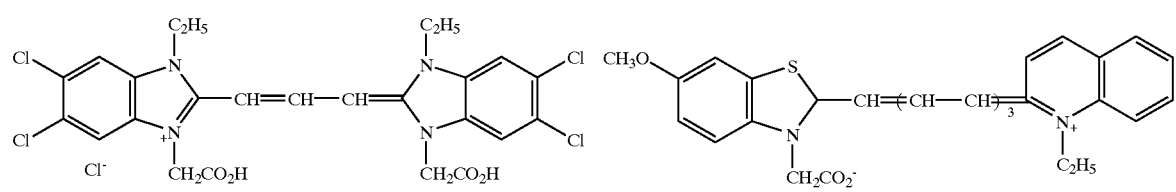
(11)
(12)
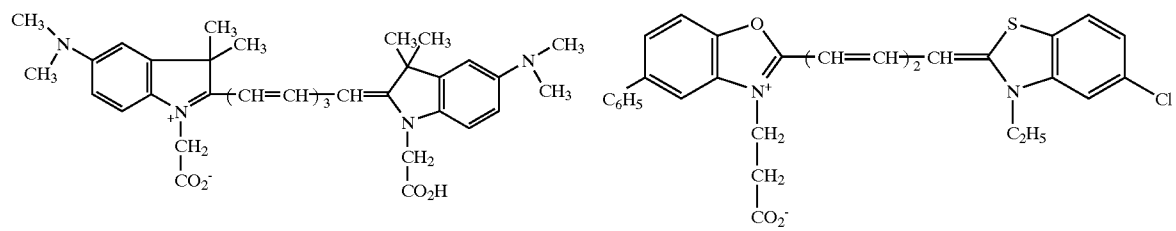
(13)
(14)
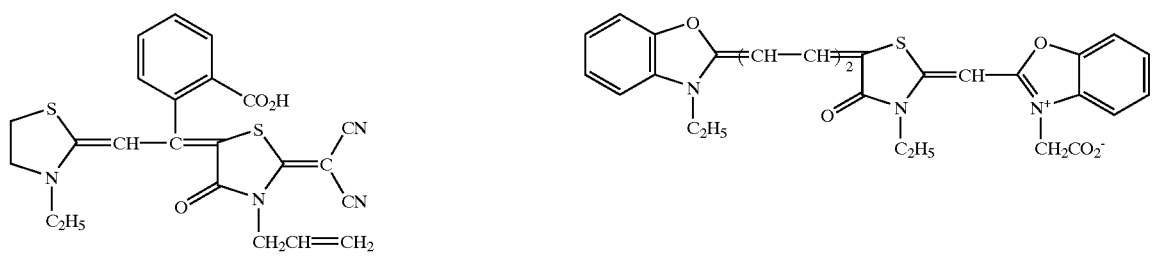
(15)
(16)
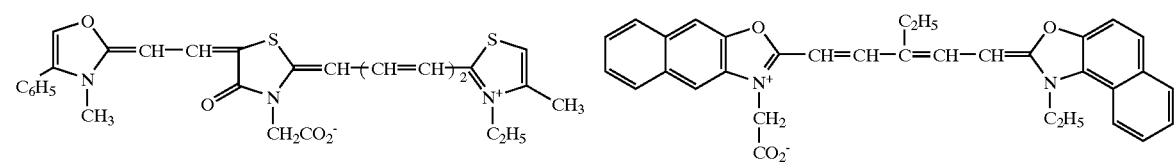
(17)
(18)
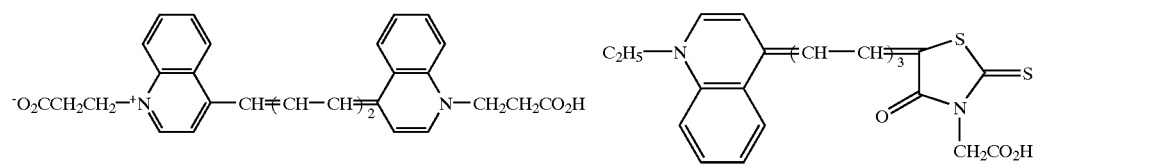
(19)

-continued
(20) 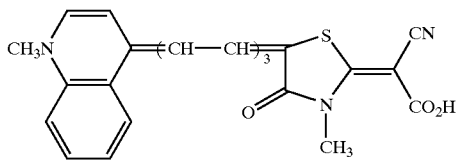
(21) 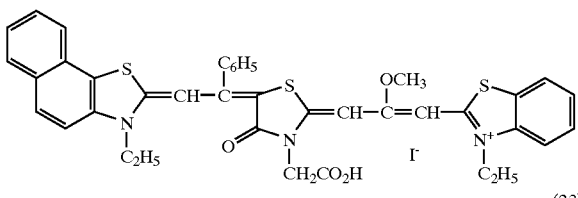
(22) 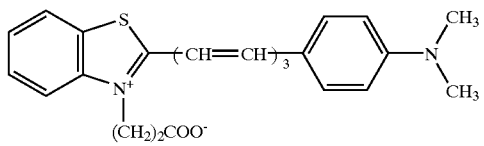
(23) 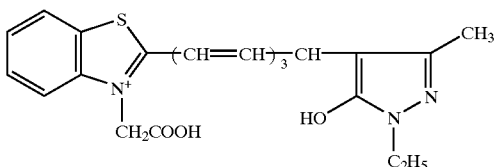
(24) 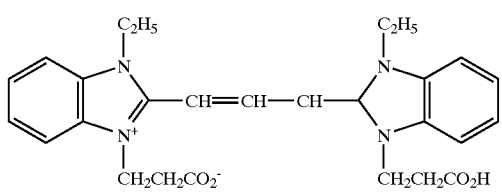
(25) 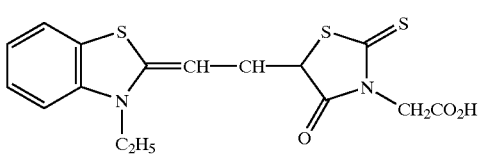
(26) 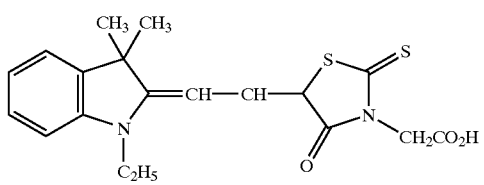
(27) 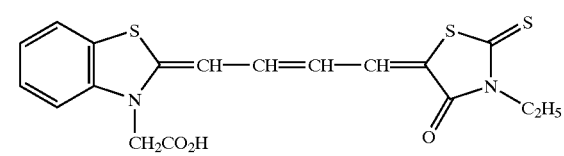
(28) 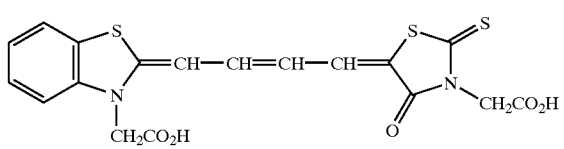
(29) 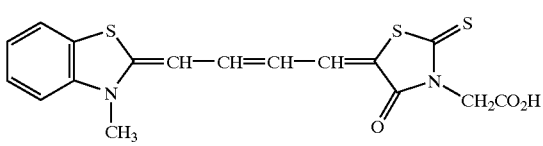
(30) 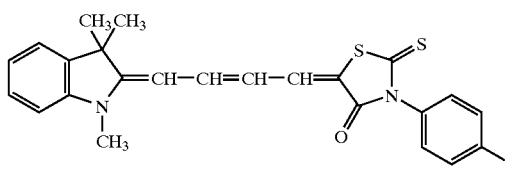
(31) 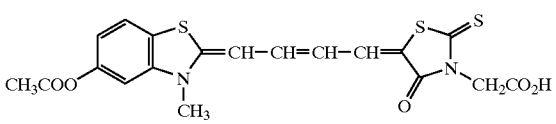
(32) 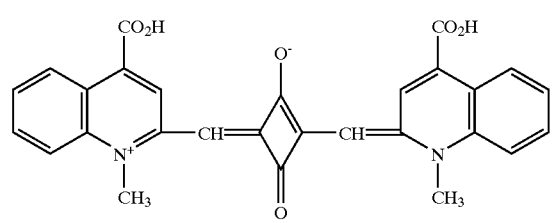
(33) 
(34) 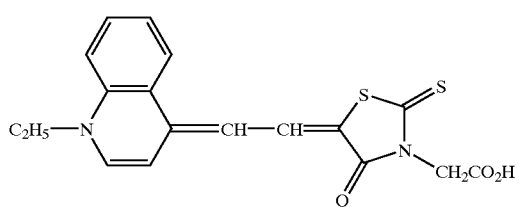
(35) 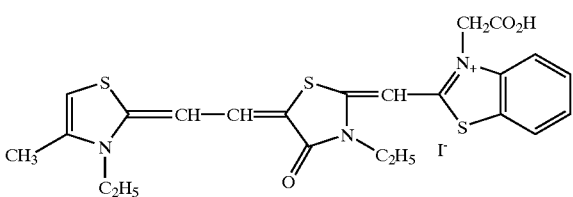

-continued

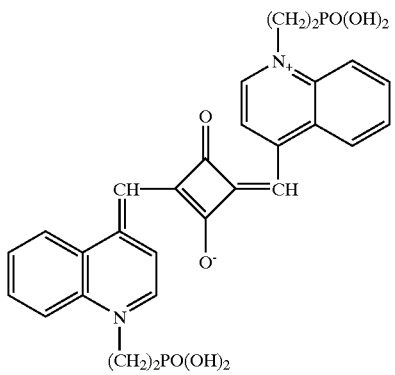 (36)

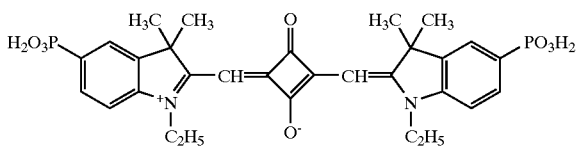 (37)

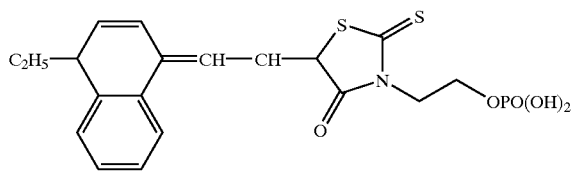 (38)

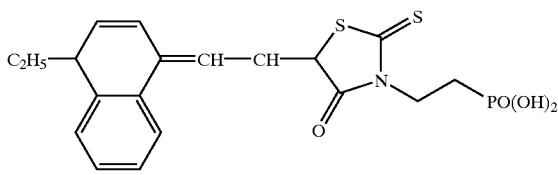 (39)

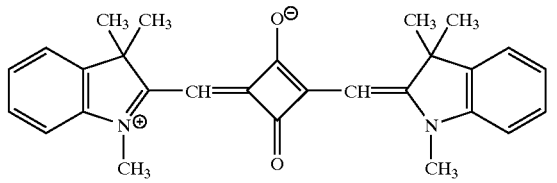 (40)

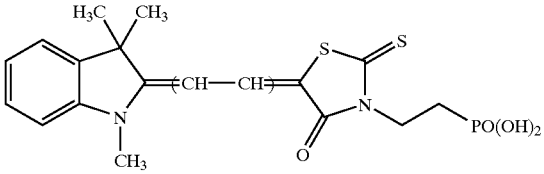 (41)

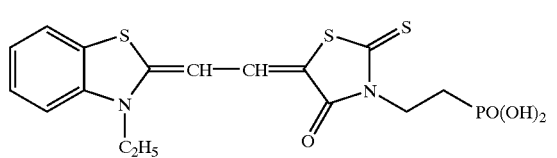 (42)

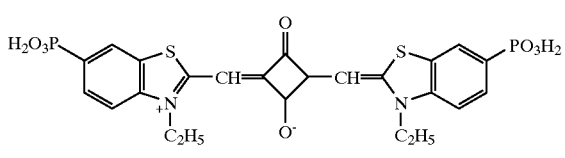 (43)

The compounds of formulae (IV) and (VI) are synthesized with reference to the teachings of F. M. Harmer, *Heterocyclic Compounds-Cyanine Dyes and Related Compounds*, John Wiley & Sons (1964), D. M. Sturmer, *Heterocyclic Compounds-Special Topics in Heterocyclic Chemistry*, ch. 18, §14, pp. 482–515, John Wiley & Sons (1977), and Rodd's *Chemistry of Carbon Compounds*, 2nd Ed., vol. IV, part B, ch. 15, cls. 369–422, Elsevier Science Publishing Company Inc. (1977), and GB Patent 1,077,611.

Adsorption of the dye onto particulate semiconductor particles is usually effected by dipping well-dried particulate semiconductor particles in a dye solution for several hours. Dye adsorption may be carried out at room temperature or under heating-reflux as described in JP-A-7-249790. Dye adsorption can be conducted either before or after the particulate semiconductor particles are applied to the conductive substrate, or the particulate semiconductor particles that the dye may be applied Simultaneously. It is preferred that the dye is adsorbed on the particulate semiconductor layer formed on the substrate.

Adsorption of the dye onto the semiconductor layer formed on the substrate can be effected by dipping well-dried work electrode containing semiconductor particles in a dye solution (e.g., immersion, dip coating, roll coating or air knife coating) or coating the semiconductor layer with a dye solution (e.g., wire bar coating, slide hopper coating, extrusion coating, curtain coating, spin coating, spraying, or printing (e.g., letterpress printing, offset printing, gravure printing, or screen printing)).

As previously described with regard to the formation of the particulate semiconductor layer, extrusion coating and various printing methods are fit for a high viscous dye solution (e.g., 0.01 to 500 Poise), while slide hopper coating, wire bar coating and spin coating are suited for a low viscous dye solution (e.g., 0.1 Poise or lower) to form a uniform film. In this way, an appropriate technique for dye adsorption is to be selected according to such parameters as the viscosity of the dye solution, the coating weight, the kind of the substrate, the speed of application, and the like. Taking the suitability to mass production, the time required for dye adsorption after dye application is conveniently as short as possible.

It is favorable to subject the semiconductor particles to heat treatment before dye adsorption for increasing the amount of the dye absorbed. In this case, it is preferred that the dye be quickly adsorbed into the heated semiconductor while it is between 40° C. and 80° C. so as to prevent water from being adsorbed to the semiconductor particles.

In order to obtain a sufficient sensitizing effect, the dyes are preferably adsorbed in a total amount of 0.01 to 100 mmol per m² of the substrate and 0.01 to 1 mmol per gram of the particle semiconductor particles. With too small a total amount of the dyes, the sensitizing effect would be insufficient. If the dyes are used in too large a total amount, the non-adsorbed dyes will float only to reduce the sensitizing effect.

A colorless compound may be adsorbed together with the dyes so as to lessen the interaction among dye molecules, such as association. Hydrophobic compounds such as carboxyl-containing steroid compounds (e.g., cholic acid) can be used for this purpose. An ultraviolet absorbent can also be co-adsorbed for the purpose of preventing deterioration by ultraviolet light.

Because the dye remaining unadsorbed causes disturbances of device performance, it should be washed away immediately after adsorption. Washing is conveniently carried out in a wet washing tank with an organic solvent, such as a molar solvent (e.g., acetonitrile) or an alcohol. After dye adsorption, the surface of the semiconductor particles can be treated with an amine to accelerate removal of the unadsorbed dye. Example of preferred amines include pyridine, 4-t-butylpyridine, and polyvinylpyridine. The amine can be used as such where it is liquid, or as dissolved in an organic solvent.

The electrolyte according to the present invention contains the compound (IA). The compound (IA) is characterized by forming a liquid crystal phase at 25° C. and is useful as an electrolyte of an electrochemical cell. As stated previously, so-called molten salts (salts that are liquid or low-melting solid at 25° C.) have a higher boiling point than low-molecular solvents to prevent a shortage of the solution and are hence advantageous for durability but, on the other hand, incapable of performing a high charge transporting function because of their high viscosity. In contrast, the compound (IA) exhibits high charge transporting ability in its liquid crystal state while having a high viscosity.

While the electrolyte containing the compound (IA) according to the present invention may further comprise a solvent and the like, it is preferred to use the compound (IA) in a proportion of at least 50% by weight base on the electrolyte. To keep the liquid crystal properties and to manifest excellent durability and high photoelectric conversion efficiency, the compound (IA) is desirably used in a proportion of 70% by weight, particularly 80% by weight, especially 90% by weight, in the electrolyte.

Unlike general solvents, the compound (IA) is substantially nonvolatile so that a photoelectric device using the same as an electrolyte is prevented from performance deterioration. Besides being excellent in durability, the device will have a high short-circuit current density and therefore exhibit excellent photoelectric characteristics.

It is preferred for the compound (IA) to have a melting point of 100° C. or lower, still preferably 80° C. or lower, particularly preferably 60° C. or lower, so that the compound may exhibit the liquid crystal properties in the working temperature range of cells or devices.

The electrolyte comprising the compound (IA) is incorporated into a cell by, for example, a method comprising heat-melting the compound (IA) and infiltrating the molten compound into the electrode or a method comprising dissolving the compound (IA) in a low-boiling solvent (e.g., methanol, acetonitrile or methylene chloride, infiltrating the solution into the electrode, and removing the solvent by heating.

Many of the compounds (IA) are more or less hydroscopic, which can be used as containing about 0.1 to 15% by weight of water.

The compounds (IA) of the present invention will now be described in detail.

In formula (IA), $Z_{111}$ represents an atomic group necessary to form a 5- or 6-membered aromatic heterocyclic cation together with the nitrogen atom. $Z_{111}$ is preferably made up of atoms selected from carbon, hydrogen, nitrogen, oxygen, and sulfur.

The 5-membered heterocyclic ring completed by $Z_{111}$ preferably includes a imidazole ring, a pyrazole ring, a triazole ring, an oxazole ring, and a thiazole ring, with an imidazole ring being preferred. The 6-membered heterocyclic ring completed by $Z_{111}$ preferably includes a pyridine ring, a pyrimidine ring, a pyridazine ring, a pyrazine ring, and a triazine ring, with a pyridine ring being preferred. These rings may have a substituent(s), such as an alkyl group, an acyloxy group, a heterocyclic group, a cyano group, an alkenyl group or an aryl group. The substituents may be connected to each other to form a condensed ring to which $R_{121}$ is bonded.

$R_{111}$ represents a substituted or unsubstituted alkyl or alkenyl group which is bonded to $N^+$ either directly or via a divalent linking group. The alkyl group may be either straight or branched and preferably has 1 to 24 carbon atom, including methyl, ethyl, propyl, butyl, isopropyl, isobutyl, pentyl, hexyl, octyl, 2-ethylhexyl, t-octyl, decyl, dodecyl, tetradecyl, 2-hexyldecyl, hexadecyl, octadecyl, cyclohexylmethyl, and octylcyclohexyl groups. The alkenyl group may be either straight or branched and preferably contains 2 to 24 carbon atoms, including vinyl and allyl groups. The substituent of the substituted alkyl or alkenyl group preferably includes (i) a substituted or unsubstituted and monocyclic or condensed aryl group preferably containing 6 to 24 carbon atoms, e.g., phenyl, 4-methylphenyl, 3-cyanophenyl, 2-chlorophenyl, and 2-naphthyl; (ii) a substituted or unsubstituted and monocyclic or condensed heterocyclic group (when it is a nitrogen-containing heterocyclic group, the nitrogen atom thereof may be quaternized) preferably having 2 to 24 carbon atoms, such as 4-pyridyl, 2-pyridyl, 1-octylpyridinium-4-yl, 2-pyrimidyl, 2-imidazolyl, and 2-thiazolyl; (iii) an alkoxy group preferably having 1 to 24 carbon atoms, such as methoxy, ethoxy, butoxy, octyloxy, methoxyethoxy, methoxypenta(ethyloxy), acryloxyloxyethoxy, and pentafluoropropoxy; (iv) an acyloxy group preferably having 1 to 24 carbon atoms, such as acetyloxy and benzoyloxy; (v) an alkoxycarbonyl group preferably having 2 to 24 carbon atoms, such as methoxycarbonyl and ethoxycarbonyl; (vi) a cyano group; and (vii) a fluorine atom. Of these substituents preferred are an alkoxy group, an alkoxycarbonyl group, and a cyano group.

The divalent linking group through which the above-described alkyl or alkenyl group is bonded to the nitrogen atom will be described later as $Q_{111}$ in formula (I-1) or (I-2) hereinafter given that is a preferred structure of compound (IA).

$X_{111}^-$ represents an anion. Preferred anions include halide anions (e.g., $Cl^-$, $Br^-$ or $I^-$), a triiodide anion ($I_3^-$), $NCS^-$, $BF_4^-$, $PF_6^-$, $O_4Cl^-$, imide anions represented by $(C_nF_{2n+1}SO_2)(C_mF_{2m+1}SO_2)N^-$ (wherein n and m each represent a positive integer of 6 or smaller), fluorosulfonate anions represented by $C_nF_{2n+1}SO_3^-$ (wherein n is a positive integer of 6 or smaller), $Ph_4B^-$, $AsF_6^-$, $SbF_6^-$, and $B_{10}Cl_{10}^-$. Particularly preferred of these anions are an iodide anion ($I^-$) and a triiodide anion ($I_3^-$).

$R_{111}$ or the substituent on the aromatic 5- or 6-membered heterocyclic ring completed by $Z_{111}$ may have the same nitrogen-containing aromatic 5- or 6-membered quaternary salt as in formula (IA).

$R_{121}$ represents a substituent serving to exhibit liquid crystal properties which contains at least one divalent cyclic group and at least one substituted or unsubstituted alkyl or alkenyl group. The divalent cyclic group includes an aromatic group, a saturated or unsaturated alicyclic group, and a combination of two or more of these cyclic groups connected directly or via a linking group. $R_{121}$ has such a structure in which a substituted or unsubstituted alkyl or alkenyl group is bonded to one end of the above-mentioned divalent cyclic group.

$R_{121}$ is preferably represented by formula (IB):

 (IB)

wherein $R_{122}$ represents a substituted or unsubstituted alkyl or alkenyl group; $Y_{111}$ represents a divalent 4- to 7-membered cyclic group or a divalent condensed cyclic group composed of 4- to 7-membered rings; $Q_{121}$ and $Q_{131}$ each represent a divalent linking group or a single bond; n represents 1, 2 or 3; when n is 2 or 3, the plural $Y_{111}$'S, $Q_{121}$'s, $Q_{121}$'s, and $Q_{131}$'s may be the same or different.

In formula (IB), the substituted or unsubstituted alkyl or alkenyl group as represented by $R_{122}$ preferably includes those described with respect to $R_{111}$, particularly an alkyl group having 6 to 24 carbon atoms. An unsubstituted straight-chain alkyl group having 6 to 12 carbon atoms is especially preferred.

Preferred examples of the divalent linking group as represented by $Q_{121}$ and $Q_{131}$ includes —CH=CH—, —CH=N—, —N=N—, —NO=N—, —COO—, —COS—, —CONH—, —COCH$_2$—, —CH$_2$CH$_2$—, —OCH$_2$—, —CH$_2$NH—, —CH$_2$—, —CO—, —O—, —S—, —NH—, -(CH$_2$)$_n$- (n: 1, 2 or 3), and combinations thereof. Still preferred of them are —CH$_2$—, —CO—, —O—, —CH=CH—, —CH=N—, —N=N—, and combinations thereof. The hydrogen atom(s) in these linking groups may be substituted. It is the most desirable that both $Q_{121}$ and $Q_{131}$ be a single bond.

$Y_{111}$ preferably represents a 6-membered aromatic ring, a 4- to 6-membered saturated or unsaturated aliphatic ring, a 5- or 6-membered heterocyclic ring, or a condensed ring composed of two or more thereof. It is preferred for $Y_{111}$ not to have a charge. Specific examples of these divalent cyclic groups are shown below. Of these groups, preferred are (Y-1), (Y-2), (Y-18), (Y-19), (Y-21), and (Y-22). Still preferred are (Y-1), (Y-2), and (Y-21).

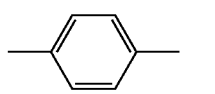 (Y-1)

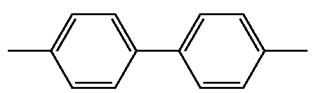 (Y-2)

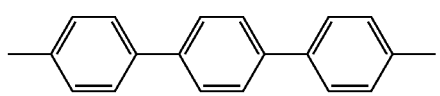 (Y-3)

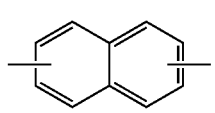 (Y-4)

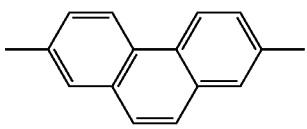 (Y-5)

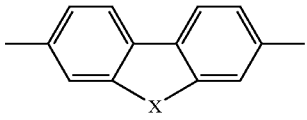 (Y-6)

X=CH$_2$, O, CO, NH

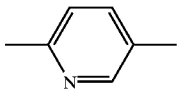 (Y-7)

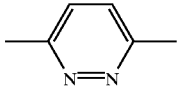 (Y-8)

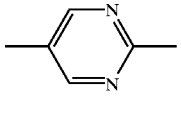 (Y-9)

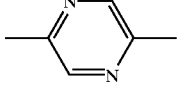 (Y-10)

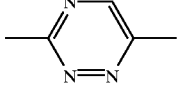 (Y-11)

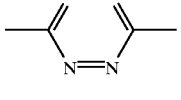 (Y-12)

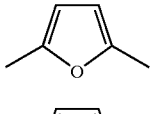 (Y-13)

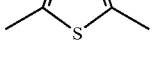 (Y-14)

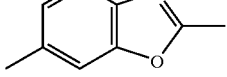 (Y-15)

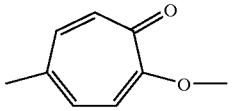 (Y-16)

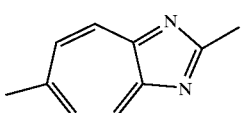 (Y-17)

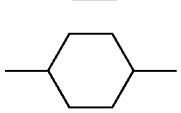 (Y-18)

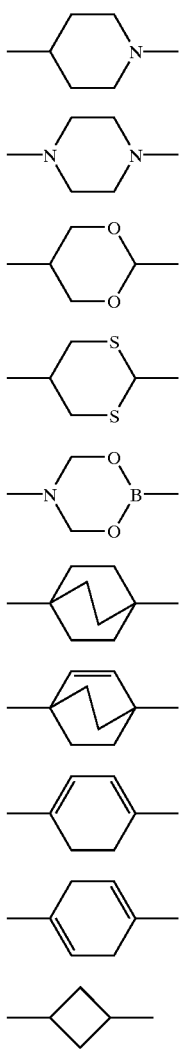

(Y-19)
(Y-20)
(Y-21)
(Y-22)
(Y-23)
(Y-24)
(Y-25)
(Y-26)
(Y-27)
(Y-28)

In formula (IB), n represents 1, 2 or 3, preferably 1 or 2. Where n is 2 or 3, the combinations of $Q_{121}$, $Y_{111}$, and $Q_{131}$ may be the same or different.

The compound (IA) is preferably represented by formula (I-1) or (I-2). The compound represented by formula (I-1) or (I-2) (hereinafter, compound (I-1) or (I-2) is a noble liquid crystal compound. In formula (I-1) or (I-2), $Q_{121}$, $Q_{131}$, $Y_{111}$, n, and $X_{111}^-$ are the same as those described above with reference to formula (IB).

In formula (I-1) or (I-2), $R_{141}$, $R_{151}$, $R_{161}$, and $R_{171}$ each represent a hydrogen atom or a substituent. It is preferred that all of them be each of hydrogen atom. The substituent represented by $R_{141}$, $R_{151}$, $R_{161}$ or $R_{171}$ preferably includes (i) a substituted or unsubstituted and straight-chain or branched alkyl group preferably having 1 to 24 carbon atoms, e.g., methyl, ethyl, isopropyl, butyl, t-butyl, octyl, 2-ethylhexyl, 2-methoxyethyl, benzyl, trifluoromethyl, cyanomethyl, ethoxycarbonylmethyl, propoxyethyl, 3-(1-octylpyridinium-4-yl)propyl, 3-(1-butyl-3-methylpyridinium-4-yl)propyl, (ii) a substituted or unsubstituted and straight-chain or branched alkenyl group preferably having 2 to 24 carbon atoms, e.g., vinyl or allyl, (iii) a substituted or unsubstituted and monocyclic or condensed aryl group preferably having 6 to 24 carbon atoms, e.g., phenyl, 4-emthyphenyl, 3-cyanophenyl, 2-chlorophenyl or 2-naphthyl, (iv) a substituted or unsubstituted and monocyclic or condensed heterocyclic group preferably having 2 to 24 carbon atoms (where it is a nitrogen-containing group, then nitrogen may be quaternized), e.g., 4-pyridyl, 2-pyridyl, 1-octylpyridinium-4-yl, 2-pyrimidyl, 2-imidazolyl, or 2-thiazolyl), (v) an alkoxy group preferably having 1 to 24 carbon atoms, e.g, methoxy, ethoxy, butoxy or octyloxy, (vi) an acyloxy group preferably having 1 to 24 carbon atoms, e.g. acetyloxy or benzoyloxy, (vii) an alkoxycarbonyl group preferably having 2 to 24 carbon atoms, e.g., methoxycarbonyl or ethoxycarbonyl, (viii) a cyano group, and (ix) a halogen atom (e.g., chlorine or bromine). Still preferred of these substituents are an alkyl group, an alkenyl group, an alkoxy group, an alkoxycarbonyl group, a cyano group, and a halogen atom. Yet preferred of them are an alkyl group, an alkenyl group, an alkoxycarbonyl group, and a cyano group. Particularly preferred are an unsubstituted alkyl group having 1 to 8 carbon atoms, a cyano- or alkoxycarbonyl-substituted alkyl group having 1 to 8 carbon atoms, an alkenyl group, and an alkoxycarbonyl group having 2 to 20 carbon atoms. Especially preferred are a methyl group, an ethyl group, a cyanomethyl group, an alkoxycarbonylmethyl group, a vinyl group, and an alkoxycarbonyl group. In particular, an unsubstituted or cyano-substituted alkyl group (e.g., a methyl group, an ethyl group, a cyanomethyl group) and an alkoxycarbonyl group (e.g., a methoxycarbonyl group, an ethoxycarbonyl group) are preferred. A methyl group is the most preferred.

$R_{131}$ represents a substituted or unsubstituted alkyl group or a substituted or unsubstituted alkenyl group (preferably having 2 to 24 carbon atoms, such as vinyl or allyl), still preferably a substituted or unsubstituted alkyl group having 6 to 24 carbon atoms, such as octyl, decyl, dodecyl or hexadecyl, particularly preferably an unsubstituted straight-chain alkyl group having 6 to 12 carbon atoms. The substituent of the substituted alkyl or alkenyl group preferably includes those enumerated as $R_{141}$, $R_{151}$, $R_{161}$, and $R_{171}$.

$Q_{111}$ represents a divalent linking group. Preferred examples of $Q_{111}$ are —C($R_{411}$)=C($R_{421}$)-, —CH=N—, —N=N—, —NO=N—, —COO—, —COS—, —CONR$_{411}$-, —COCH$_2$-, —CH$_2$CH$_2$-, —OCH$_2$-, —CH$_2$NR$_{411}$-, —C($R_{411}$)$_2$- —CO—, —O—, —S—, —NR$_{411}$-, -(C($R_{411}$)$_2$)$_n$-, —COO—, —C($R_{411}$)=C($R_{421}$)-CO—, -(C≡C)$_n$-, phenylene, cyclohexylene, and combinations thereof, wherein $R_{411}$ and $R_{421}$ each represent a hydrogen atom or an alkyl group, and n represents 1, 2 or 3. Still preferred among them are those composed of the repeating unit -(C($R_{411}$)$_2$)$_n$- and phenylene, cyclohexylene, —CO—, —O—, —CH=CH—, —CH=N— or —N=N—. Note that $Q_{111}$ does not represent a polymethylene group nor a phenylenebis(poly)methylene group without containing a hetero atom.

Preferred linking groups as $Q_{111}$ are represented by formula (II) or (III):

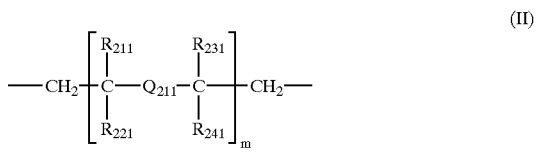

(II)

wherein $Q_{211}$ represents a divalent linking group except a methylene group; $R_{211}$, $R_{221}$, $R_{231}$, and $R_{241}$ each represents a hydrogen atom or a substituent, and any one of them may be connected to $Q_{211}$ to form a ring; and m represents 0 or 1; provided that formula (II) does not represent a polymethylene group without containing a hetero atom.

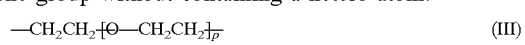

(III)

wherein p represents an integer of 1 to 30.

In formula (II), the divalent linking group as $Q_{211}$ preferably includes those described for $Q_{111}$; the substituent as $R_{211}$, $R_{221}$, $R_{231}$, and $R_{241}$ preferably includes those described for $R_{141}$, $R_{151}$, $R_{161}$, and $R_{171}$; and m is preferably 1. One or more of $R_{211}$, $R_{221}$, $R_{231}$, and $R_{241}$ may be taken together with $Q_{211}$ to form a ring. $Q_{211}$ does not represent a methylene group, and formula (II) does not represent a polymethylene group without containing a hetero atom. In formula (III), m preferably represents an integer of 4 to 20, particularly 5 to 18.

Two or more compounds (I-1) or (I-2) having different linking groups $Q_{111}$ or different linking groups of formulae (II) and (III) can be used as a mixture. In this case, different compounds (I-1) or (I-2) separately synthesized can be mixed at an arbitrary ratio, or two or more starting compounds having different linking groups are used in synthesis to obtain the mixture of the compounds (I-1) or (I-1).

For example, a mixture of compounds (I-1) or (I-2) having different linking groups of formula (III) which are different in p number can be synthesized by using a mixture of starting compounds providing different linking groups of formula (III) which are different in p number. The starting compound providing the linking group of formula (III) is represented by, for example, formula (VII):

     (VII)

The mixture of the starting compounds of formula (VII) having different p numbers is easily synthesized from polyethylene oxide having a p distribution, i.e., a molecular weight distribution. The different p numbers of such a mixture are sometimes represented by its average as in the specific examples hereinafter given.

Specific examples of the compounds (IA) are shown below by way of cation/anion combinations of formula (IA), but the invention is by no means limited thereto.

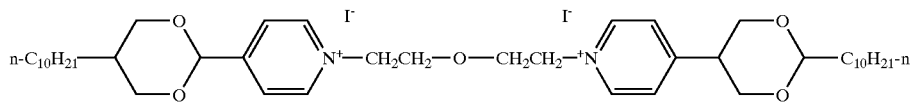
(F-1)

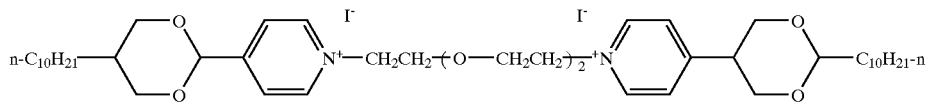
(F-2)

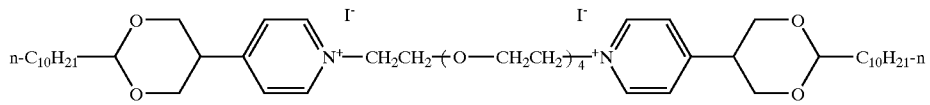
(F-3)

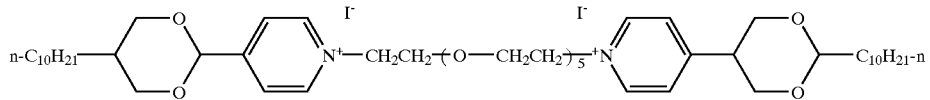
(F-4)

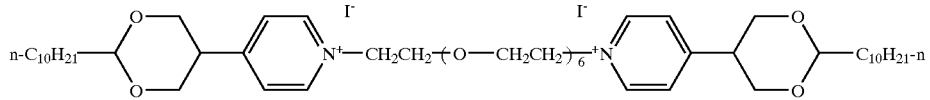
(F-5)

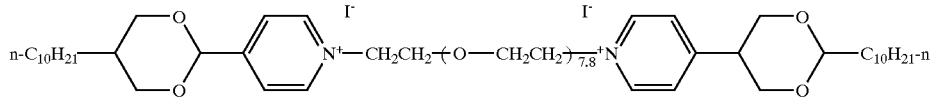
(F-6)

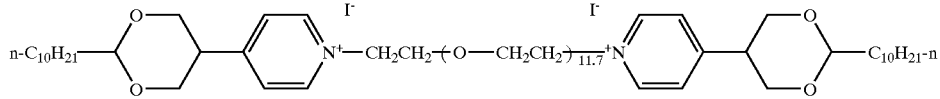
(F-7)

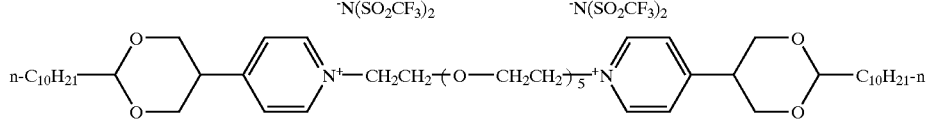
(F-8)

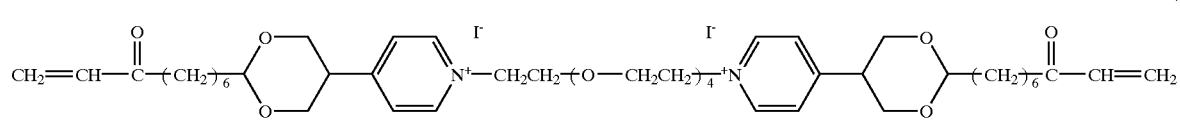
(F-9)

-continued
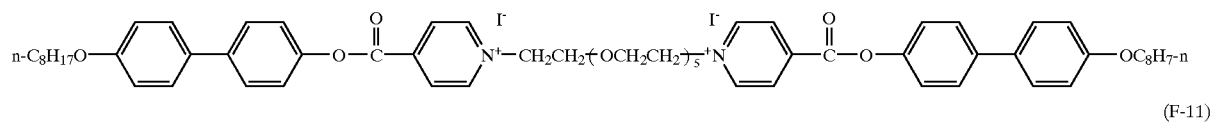
(F-10)
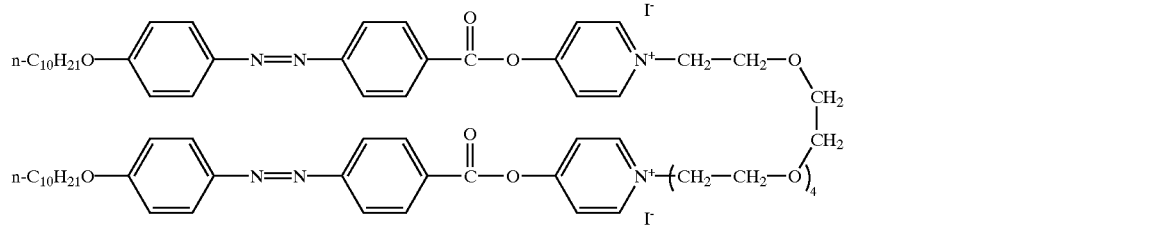
(F-11)
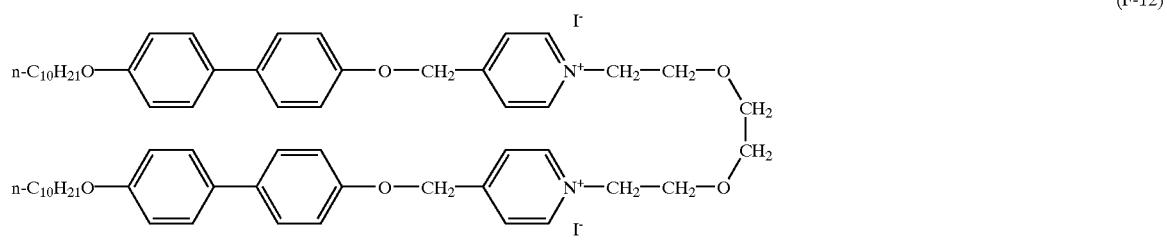
(F-12)
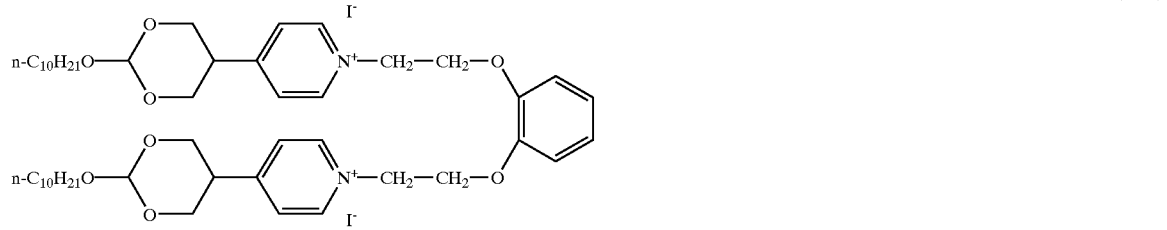
(F-13)
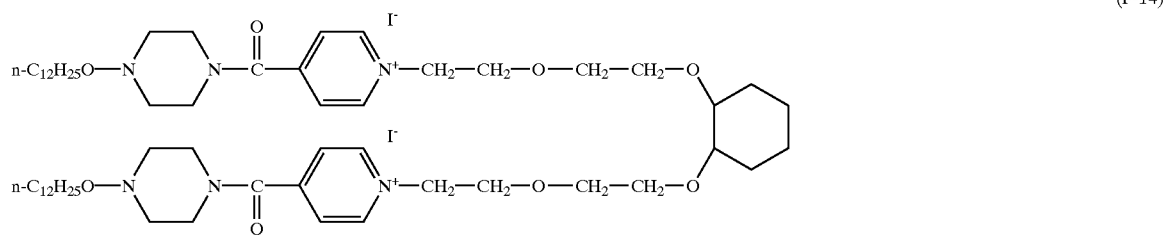
(F-14)
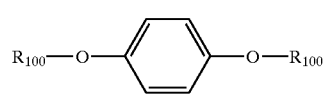
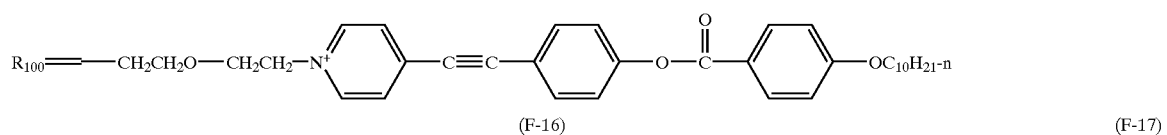
(F-15)
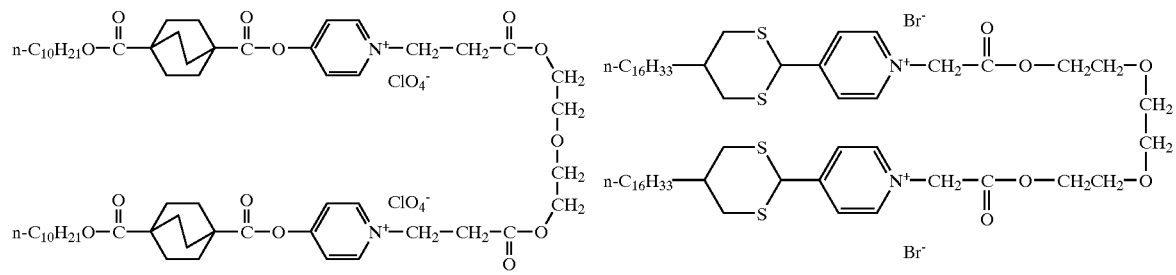
(F-16)  (F-17)

-continued
(F-18)
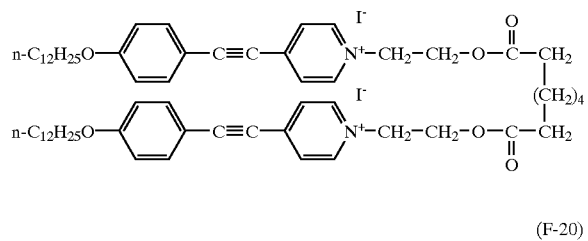
(F-19)
(F-20)
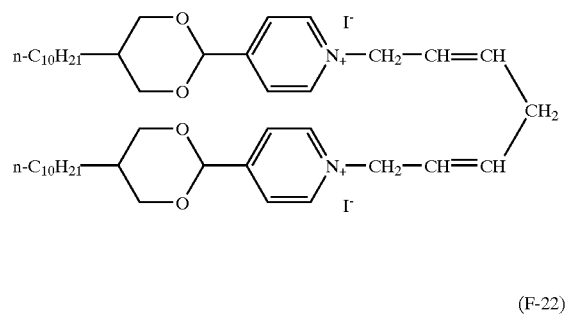
(F-21)
(F-22)
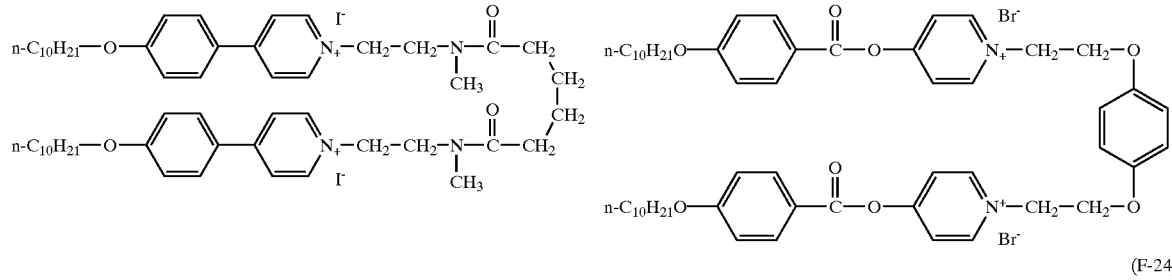
(F-23)
(F-24)
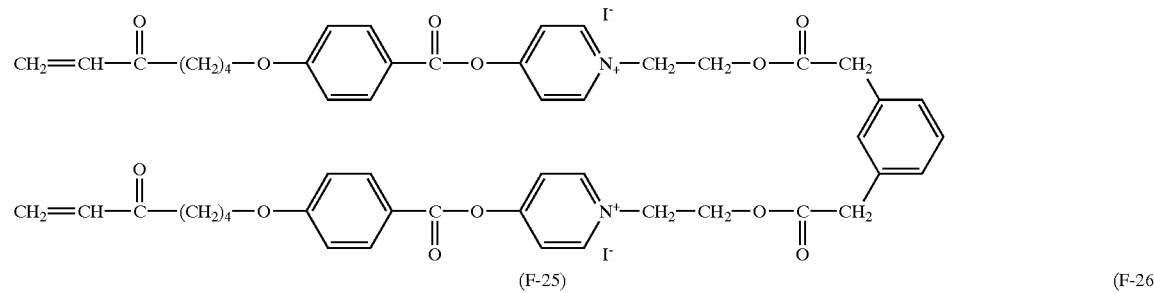
(F-25)
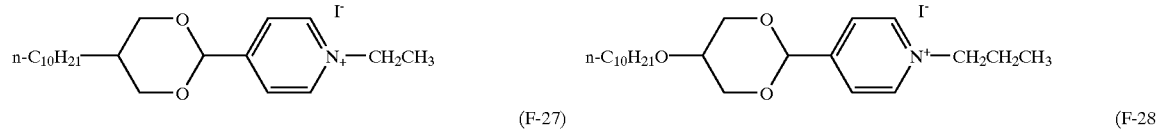
(F-26)
(F-27)
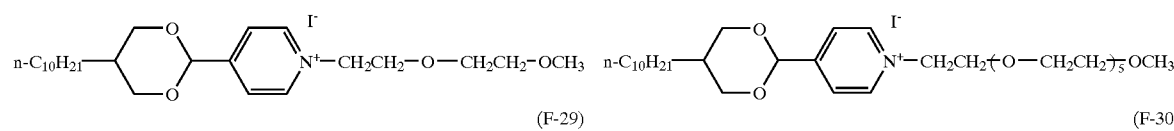
(F-28)
(F-29)
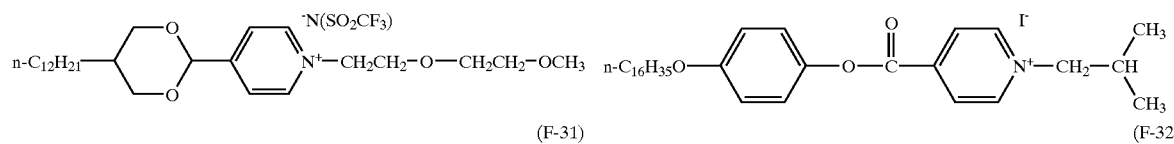
(F-30)
(F-31)
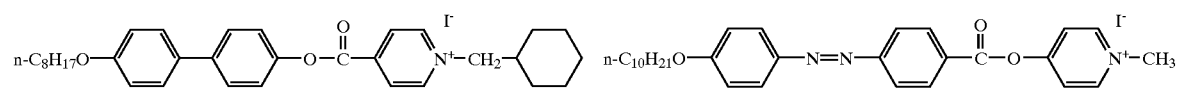
(F-32)

-continued
(F-33)
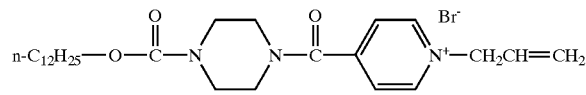
(F-34)
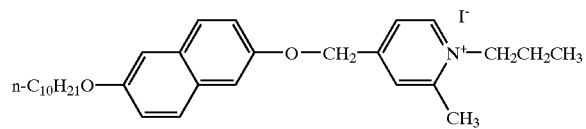
(F-35)
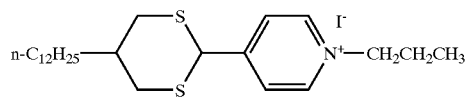
(F-36)
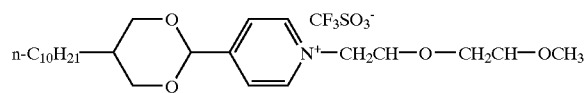
(F-37)
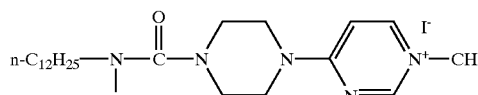
(F-38)
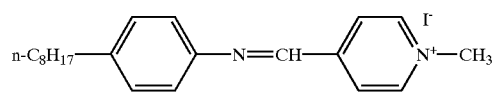
(F-39)
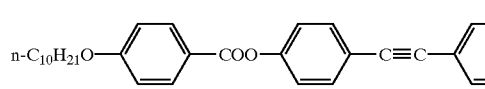
(F-40)
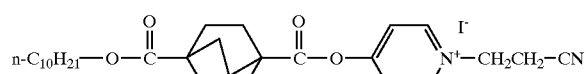
(F-41)
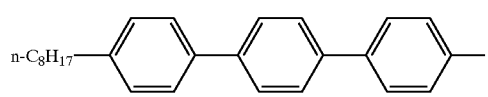
(F-42)
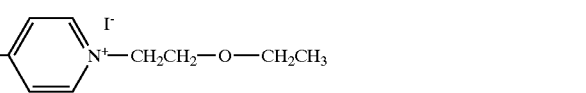
(F-43)
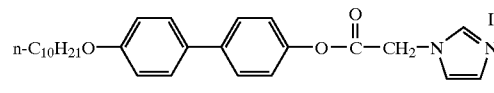
(F-44)
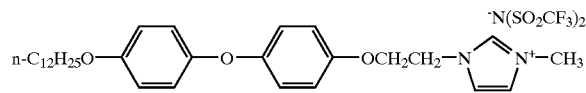
(F-45)
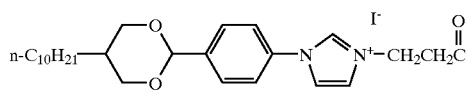
(F-46)
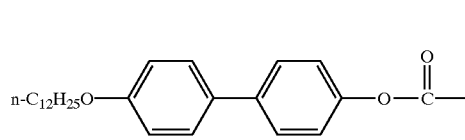
(F-47)
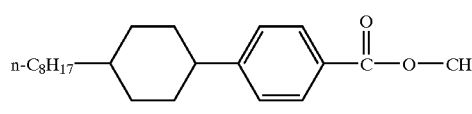
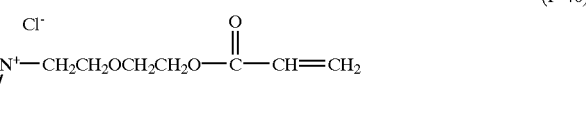
(F-48)
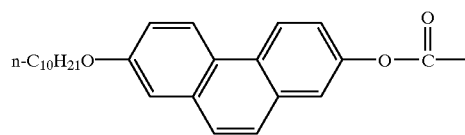
(F-49)
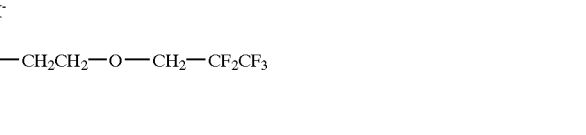
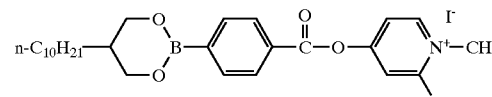
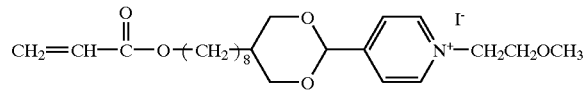
(F-50)
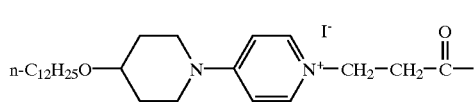

-continued

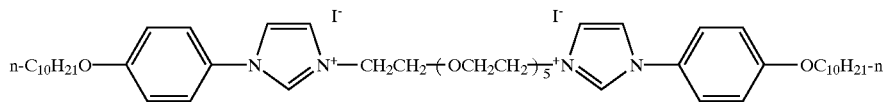
(F-51)

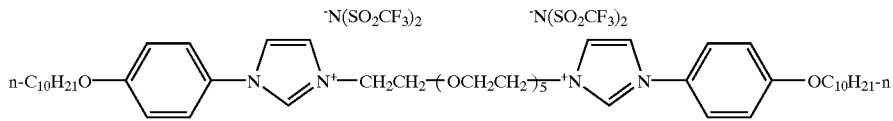
(F-52)

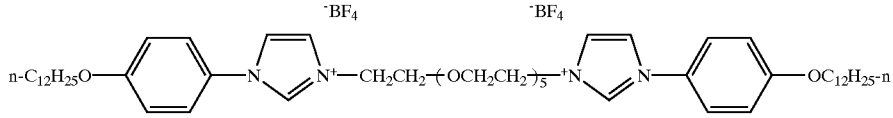
(F-53)

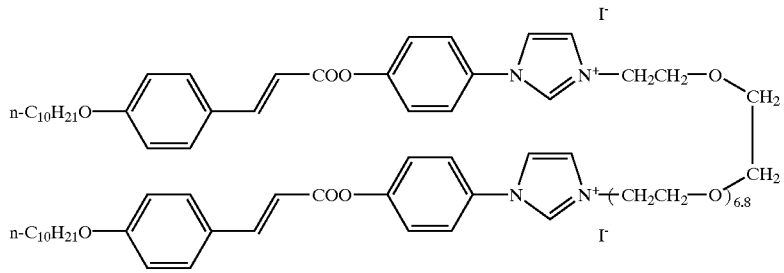
(F-54)

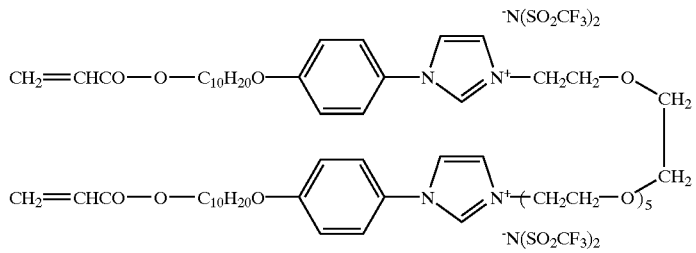
(F-55)

Where the compound (IA) is used as an electrolyte of a photo-electrochemical cell, a plurality of the compounds different in anion species can be used as a mixture in an arbitrary mixing ratio. In this case, it is preferred that at least one of the compounds (IA) has an iodide ion (I$^-$) as the anion $X_{111}{}^-$ and at least one of the other compounds (IA) has a triiodide ion (I$_3{}^-$) as $X_{111}{}^-$. The ratio of I$_3{}^-$ to I$^-$ in the mixture is preferably 0.1 to 50 mol %, still preferably 0.1 to 20 mol %, particularly preferably 0.5 to 10 mol %, especially preferably 0.5 to 5 mol %.

Where the mixture of the compounds (IA) contains a compound (IA) whose anion $X^{111-}$ is other than I$^-$ and I$_3{}^-$, the ratio of such a compound (IA) is preferably 0.1 to 90 mol %, still preferably 0.1 to 50 mol %, particularly preferably 0.1 to 10 mol %, based on the total amount of the compound (s) having I$^-$ and the compound(s) having I$_3{}^-$. The compound having I$_3{}^-$ is easily obtainable by addition of I$_2$ to the compound having I$^-$. Accordingly, the mixture having I$^-$ and I$_3{}^-$ for use as an electrolyte is preferably prepared by adding a predetermined amount of I$_2$ to a previously synthesized compound having I$^-$.

The liquid crystal compound (IA) and the mixture thereof can be mixed with an alkali metal salt and/or an alkaline earth metal salt to provide a liquid crystal composition useful as an electrolyte. The composition containing an alkali metal salt and/or an alkaline earth metal salt will hereinafter be simply referred to as a liquid crystal composition. The alkali or alkaline earth metal salts preferably include those formed of an anion selected from those enumerated for $X_{111}{}^-$ and an alkali or alkaline earth metal cation, such as Li$^+$, Na$^+$, K$^+$, Rb$^+$, Cs$^+$, Fr$^+$, Be$^{2+}$, Mg$^{2+}$, Ca$^{2+}$, Sr$^{2+}$, Ba$^{2+}$, and Ra$^{2+}$. Preferred of them are those formed of a cation selected from Li$^+$, Na$^+$, K$^+$, Mg$^{2+}$, Ca$^{2+}$, and Ba$^{2+}$ and an anion selected from I$^-$, I$_3{}^-$, (CF$_3$SO$_2$)$_2$N$^-$, CF$_3$SO$_3{}^-$, CF$_3$CO$_2{}^-$, PF$_6{}^-$, BF$_4{}^-$, and ClO$_4{}^-$. Those formed of a cation selected from Li$^+$, Na$^+$, and K$^+$ and an anion selected from I$^-$, I$_3{}^-$, and (CF$_3$SO$_2$)$_2$N$^-$ are particularly preferred.

The alkali or alkaline earth metal salt is added in such an amount that is uniformly mixed with the liquid crystal compound or the liquid crystal compound mixture, which is preferably 0.1 to 5 molar equivalents, still preferably 0.1 to 2 molar equivalents to the total amount of the liquid crystal compounds.

The liquid crystal compound or the liquid crystal mixture or the liquid crystal composition can further comprise other electrolytes, such as an iodine salt of quaternary imidazolium compounds, as iodine salt of tetraalkylammonium compounds, combinations of Br$_2$ and metal bromides (e.g., LiBr, NaBr, KBr, CsBr or CaBr$_2$), combinations of Br$_2$ and a bromine salt of quaternary ammonium compounds (e.g., a tetraalkylammonium bromide or pyridinium bromide), metal complexes (e.g., a ferrocyananate-ferricyanate system or a ferrocene-ferricinium ion system), sulfur compounds (e.g., poly(sodium sulfite) and an alkylthiol-alkyl disulfide), viologen dyes, and a hydroquinone-quinone system. The proportion of these other compounds in the electrolyte is preferably up to 30% by weight.

The compound (IA) can be used in combination with not more than an equal weight of a solvent. In other words, it is preferred for the electrolyte of the present invention to contain at least 50% by weight of the liquid crystal compound (IA), the liquid crystal mixture, or the liquid crystal composition according to the present invention. A preferred content of the liquid crystal compound (IA), the liquid crystal mixture, or the liquid crystal composition in the electrolyte is 70% by weight or more, particularly 90% by weight or more.

Where a solvent is used, it is preferred for the solvent to have a low viscosity to bring about an improvement in ion mobility or to have a high dielectric constant to bring about an increase in effective carrier concentration, thereby to help the electrolyte manifest excellent ion conductivity. Examples of the solvents suitable from this viewpoint include carbonate compounds, such as ethylene carbonate and propylene carbonate; heterocyclic compounds, such as 3-methyl-2-oxazolidinone; ether compounds, such as dioxane and diethyl ether; acyclic ethers (i.e., chain ether), such as ethylene glycol dialkyl ethers, propylene glycol dialkyl ethers, polyethylene glycol dialkyl ethers, and polypropylene glycol dialkyl ethers; alcohols, such as methanol, ethanol, ethylene glycol monoalkyl ethers, propylene glycol monoalkyl ethers, polyethylene glycol monoalkyl ethers, and polypropylene glycol monoalkyl ethers; polyhydric alcohols, such as ethylene glycol, propylene glycol, polyethylene glycol, polypropylene glycol, and glycerol; nitrile compounds, such as acetonitrile, glutaronitrile, methoxyacetonitrile, propionitrile, and benzonitrile; esters, such as carboxylic acid esters, phosphoric acid esters, and phosphonic acid esters; aprotic polar solvents, such as dimethyl sulfoxide and sulfolane; and water. Preferred of them are carbonate compounds, such as ethylene carbonate and propylene carbonate; heterocyclic compounds, such as 3-methyl-2-oxazolidinone; nitrile compounds, such as acetonitrile, and benzonitrile; and esters. These solvents can be used either individually or as a combination thereof.

Specific but non-limiting examples of the solvents are shown below.

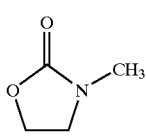

S-1

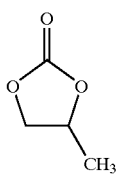

S-2

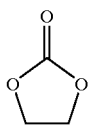

S-3

CH$_3$CN

S-4

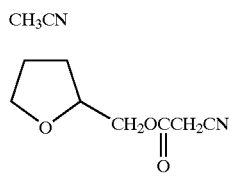

S-5

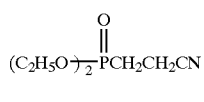

S-6

CH$_3$OCH$_2$CH$_2$OCH$_3$

S-7

From the standpoint of resistance to volatilization in improvement of durability, the boiling point of the solvent is preferably 200° C. or higher, still preferably 250° C. or higher, particularly preferably 270° C. or higher, under atmospheric pressure. Accordingly, S-5 and S-6 are preferred.

There are two conceivable methods of forming a charge transporting layer. One comprises adhering a counter electrode to the dye-sensitized semiconductor layer and penetrating a liquid charge transporting material (layer) into the interface therebetween. The other comprises forming directly a charge transporting layer on the dye-sensitized semiconductor layer and then forming a counter electrode thereon. The former method can be effected by (i) an ordinary pressure process which makes us of capability by, for example, soaking or (ii) a vacuum process in which a gas phase is displaced with a liquid phase under reduced pressure.

Where the latter method is followed, the charge transporting layer can be applied in the same manner as for the formation of the particulate semiconductor-containing layer or for the dye adsorption, i.e., immersion, roll coating, dip coating, air knife coating, extrusion coating, slide hopper coating, wire bar coating, spin coating, spraying, casting, and various printing methods. The thickness of the charge transporting layer comprising the electrolyte of the present invention is preferably 0.001 to 200 μm, still preferably 0.1 to 100 μm.

In a photo-electrochemical cell using the photoelectric device, the counter electrode functions as a positive electrode. The counter electrode usually has the same structure as the aforementioned electrically conductive substrate, but a substrate is not always required as far as sufficient strength is secured. For securing clogging property, a counter electrode having a substrate is advantageous.

At least one of the conductive substrate of the work electrode and the counter electrode must be substantially transparent so that incident light can reach the photosensitive layer. It is preferred for the photo-electrochemical cell of the present invention that the conductive substrate of the work electrode be transparent and that light be incident upon this side. In this case, it is a preferred embodiment that the counter electrode has light reflecting properties.

The counter electrode that can be used in the photo-electrochemical cell of the present invention includes a glass or plastic substrate having a metal or a conductive oxide described thereon or a thin metal film having a thickness of 5 μm or less (preferably 5 nm to 3 μm) which can be formed by deposition (e.g., vacuum evaporation), sputtering or a like technique. A preferred counter electrode is a glass plate having platinum deposited thereon by vacuum evaporation or a metal thin film formed by vacuum evaporation or sputtering.

The photo-electrochemical cell of the present invention may have its sides sealed with a polymer an adhesive, etc. to prevent deterioration by oxidation.

Aspects of the present invention and preferred embodiments thereof are summarized below.

(1) A liquid crystal compound represented by formula (I-1) or (I-2)..
(2) The liquid crystal compound as set forth in (1), wherein $X_{111}$ is an iodide anion.
(3) The liquid crystal compound as set forth in (1) or (2), wherein $Q_{111}$ is represented by formula (II).
(4) The liquid crystal compound as set forth in (1) or (2), wherein $Q_{111}$ is represented by formula (III).
(5) A liquid crystal mixture comprising at least two liquid crystal compounds set forth in (1) to (4).
(6) The liquid crystal mixture as set forth in (5), wherein the at least two liquid crystal compounds have $Q_{111}$ represented by formula (III) and are different from each other in number of p.
(7) A liquid crystal composition the liquid crystal compound as set forth in any one of (1) to (4) or the liquid crystal mixture as set forth in (5) or (6) and at least one compounds selected from an alkali metal salt and an alkaline earth metal salt.
(8) An electrolyte containing at least one liquid crystal compound represented by formula (IA).
(9) The electrolyte as set forth in (8), wherein $Z_{111}$ in formula (IA) is pyridinium or imidazolium.
(10) The electrolyte as set forth in (8) wherein the compound represented by formula (IA) is a compound represented by formula (I-1) or (I-2).
(11) The electrolyte as set forth in (8), (9), (10or (11), wherein the content of the at least one liquid crystal compound or the liquid crystal composition of 50% by weight or more.
(13) The electrolyte as set forth in any one of (10) to (12), which contains iodine.
(14) An electrochemical cell having the electrolyte as set forth in any one of (10) to (13).
(15) A photo-electrochemical cell comprising a semiconductor responsive to a radiant ray and a charge semiconductor responsive to a radiant ray and a charge transporting layer containing the electrolyte according to any one of (10) to (13).
(16) The photo-electrochemical cell as set forth in (15), wherein the semiconductor is a particulate semiconductor sensitized with a dye.
(17) The photo-electrochemical cell as set forth in (16), wherein the particulate semiconductor is a metal chalcogenide.
(18) The photo-electrochemical cell as set forth in (17), wherein the metal chalcogenide comprises titanium oxide.
(19) The photo-electrochemical cell as set forth in any one of (15) to (18) ,wherein the dye is a metal complex dye and/or a polymethine dye.

The present invention will now be illustrated in greater detail with reference to Examples, but is should be understood noted, all the percents are given by weight.

EXAMPLE 1

Liquid crystal compounds (F-2, F-4, F-6, F-51 and F-54 were synthesized in accordance with the process described in Liquid Crystals, vol. 21, No. 10, p. 923 (1996). The reaction scheme followed is shown immediately below.

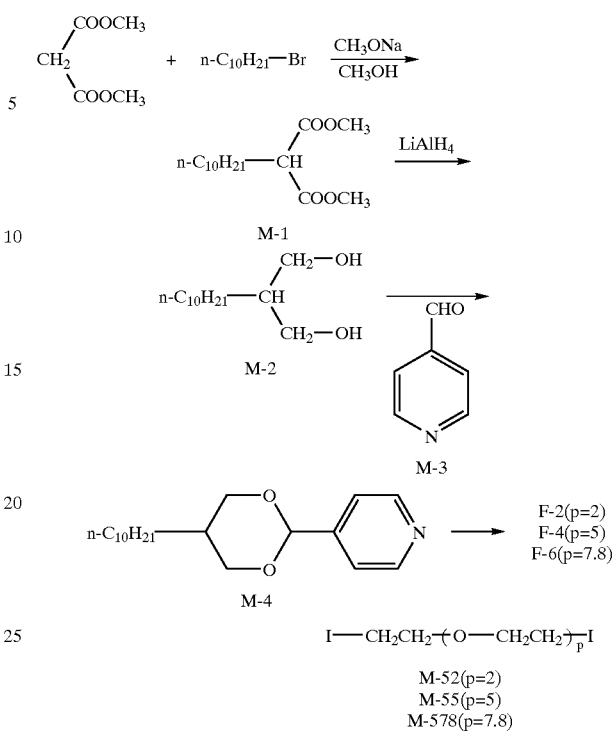

(1) Synthesis of F-2
(a) Synthesis of intermediate compound M-1 methanol, and 88 mm of a 28% methanolic solution of sodium methoxide was added to the solution. Further, 96.2 g 439 mmol) of 1-bromodecane was added thereto dropwise over 1 hour, followed by refluxing for 8 hours. The reaction mixture was poured into diluted hydrochloric acid, neutralized and extracted with ethyl acetate. The extract was dried over magnesium sulfate and concentrated under reduced pressure. The residue was distilled under reduced pressure to give 41 g of M-1 (the fraction at 3 mmHg/82° C.).
(b) Synthesis of intermediate compound M-2
In 150 ml of diethyl ether was dispersed 11 g (289 mmol) of lithium aluminum hydride. A solution of M-1 (41 g, 170 mmol) obtained in (a) above dissolved in 50 ml of diethyl ether was added dropwise to the dispersion over 2 hours while stirring at room temperature, followed by refluxing for 3 hours. The reaction mixture was made acidic by slowly pouring into diluted over magnesium sulfate, and the solvent was evaporated under reduced pressure to give 31 g of an oily crude product. The crude product was purified by silica gel column chromatography to obtain 14 g of M-2 as a colorless oily substrate.
(c) Synthesis of intermediate compound M-4
In 50 ml of toluene were dispersed 13.85 g (64 mmol) of M-2 obtained in (b) above and 6.86 g (64 mmol) of M-3, and 12 g of p-toluenesulfonic acid was added thereto. The mixture was heated under reflux for 5 hours while driving out water produced. The reaction mixture was poured into 100 ml of water containing 10 g of potassium carbonate and extracted with ethyl acetate. The extract was dried, and the solvent was evaporated under reduced pressure. The residue was recrystallized from acetonitrile to obtain 7 g of M-4 as a crystal.
(d) Synthesis of F-2
In 10 ml of acetonitrile were dispersed 1 g (3.28 mmol) of M-4 and 0.42 g (1.13 mmol) of M-52 (p=2), and the dispersion was heated under reflux for 8 hours. The reaction mixture was concentrated, and the residue was purified by silica gel column chromatography (developing solvent: methylene chloride/methanol=20/1) to obtain F-2. Recrystallization from ethyl acetate gave 1.31 g of F-2 crystals. The structure of the product was confirmed by the NMR spectrum.

(2) Synthesis of F-4

F-4 was obtained in a yield of 1.1 g in the same manner as for F-2, except for replacing M-52 (p=2) with M-55 (p=5).

(3) Synthesis of F-6

F-6 was obtained in a yield of 1.4 g in the same manner as for F-2, except for replacing M-52 (p=2) with M-578 (p=7.8 (average)) which was synthesized from polyethylene glycol having an average molecular weight of 400.

(4) Synthesis of F-51

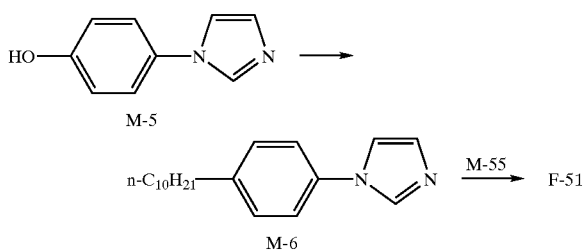

(a) Synthesis of intermediate compound M-6

N-(4-hydroxyphenyl)imidazole [M-5] (4.8 g, 30 mmol) was dissolved in THF (30 ml), and sodium hydride (60% in oil, 1.32 g, 33 mmol) was added to the solution at a bulk temperature of 5° C. Further, 1-bromodecane (6.63 g, 30 mol) was added thereto dropwise. After the resulting reaction mixture was stirred at room temperature, the obtained reaction solution was poured into water and then extracted with ethyl acetate. The obtained extract (i.e., organic phase) was dried over magnesium sulfate, and then concentrated. The obtained concentrate was crystallized with acetonitrile to obtain 6.1 g of M-6 as a crystal.

(b) Synthesis of F-51

In acetonitrile, M-6 (0.45 g, 1.50 mmol) and M-55 (0.38 g, 0.757 mmol) described above were dissolved, and the reaction mixture was heated under reflux for 8 hours. After completion of reaction, the reaction solution was concentrated, and purified by silica gel column chromatography to obtain 0.48 g of F-51 as a pale yellow substance.

(5) Synthesis of F-52

In a solution of methylene chloride/water (10 ml/10 ml), F-51 obtained in the item (4) was dissolved, and LiN(SO$_2$CF$_3$)$_2$ (0.137 g, 0.543 mmol) was added thereto while stirring. Then, the methylene chloride phase was separated, concentrated and then purified by silica gel column chromatography to obtain 0.21 g of F-52 as a colorless oily substance.

(6) Synthesis of F-54

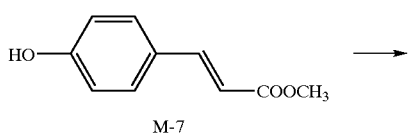

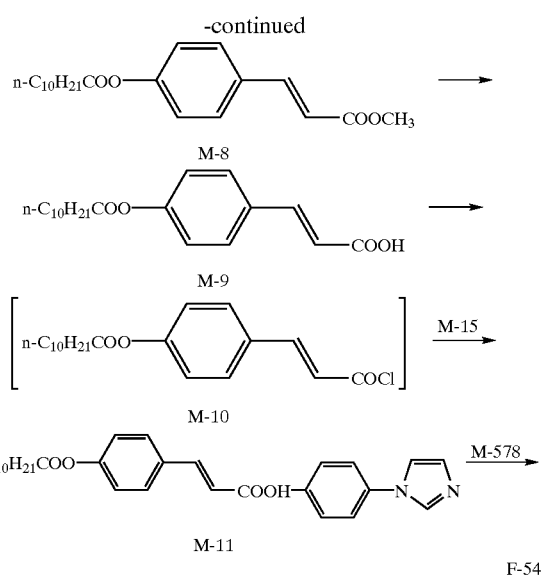

(a) Synthesis of intermediate compound M-8

4-Hydroxycinnamic acid methyl ester [M-17] (5.0 g, 28 mmol) was dissolved in DMF, and 7.8 g of potassium carbonate was added to the solution at a bulk temperature of 80° C. Further 1-bromodecane (6.5 g, 29 mmol) was added thereto dropwise. After the resulting reaction mixture was stirred at 80° C. for 1 hour, the obtained reaction solution was added with water and ethyl acetate and extracted.

The obtained extract (i.e., organic phase) was dried over magnesium sulfate and then concentrated.

The obtained concentrate was crystallized with acetonitrile to obtain 8.2 g of M-8.

(b) Synthesis of intermediate compound M-9

The above obtained M-8 (8.1 g, 25.4 mmol) was dispersed in 100 ml of methanol, and a solution of KOH/water ((2.85 g, 50.8 mmol)/10 ml) was added to the dispersion. The dispersion was subjected to reflux and cooled at room temperature. Then, 100 ml of water was added to the obtained reaction solution and adjusted to acidic region. The precipitated crystal was filtered, washed with water and dried to obtain 6.6 g of M-9.

(c) Synthesis of intermediate compound M-11

The above obtained M-9 (1.0 g, 3.28 mmol) was dissolved in a solution of acetonitrile/dimethylacetoamido (10 ml/5 ml), and further 0.26 ml of thionychloride was added thereto under room temperature. After stirring for 30 minutes, M-5 (0.525 g, 3.28 mmol) was added to the solution, and subsequently 1 ml of triethylamine was added and then stirred for 5 hours. The obtained reaction solution was adjusted to a basic region with addition of 20 ml of K$_2$CO$_3$/water solution. The precipitated solid was filtered.

The filtered solid was dissolved in ethyl acetate and filtered under heating to remove an insoluble residue. The obtained filtrate was concentrated. The obtained concentrate was crystallized from acetonitrile to obtain 0.8 g of M-11.

(d) Synthesis of F-54

The above obtained M-11 (0.7 g, 1.57 mmol) and M-578 (0.48 g, 0.784 mmol) were dispersed in acetonitrile and heated under reflux for 8 hours. After cooled at room temperature, the precipitated crystal (unreacted M-11) was filtered. The obtained filtrate was purified by silica gel column chromatography to obtain 0.6 g of F-54. The structure of the product was confirmed by the $^1$H-NMR spectrum.

EXAMPLE 2

(1) Preparation of titanium dioxide dispersion

In a 200 ml stainless steel-made vessel having its inner wall coated with Teflon were charged 15 g of titanium dioxide (Degussa P-25, produced by Nippon Aerosil Co., Ltd.), 45 g of water, 1 g of a dispersant (Triton X-100, produced by Aldrich Corp.)., and 30 g of zirconia beads having a diameter of 0.5 mm (produced by Nikkato Corp.) and dispersed in a sand grinder mill (produced by Imex Co., Ltd.) at 1500 rpm for 2 hours. The zirconia beads were filtered off the dispersion. The average particle size of the dispersed titanium dioxide particles was 2.5 μm as measured with Mastersizer manufactured by Malvern Corp.

(2) Preparation of dye-sensitized $TiO_2$ electrode

Electrically conductive glass having an F-doped tin oxide coat (TCO Glass-U, produced by Asahi Glass Co., Ltd.; surface resistivity: about 30 Ω/□ (square)) was cut to squares with 20 mm-sides. The titanium dioxide dispersion prepared in (1) was applied with a glass bar to the conductive surface side of 8 glass pieces at a time in the following manner. An adhesive tape was stuck to one end (over a 3 mm width from the edge) of the conductive surface of each glass piece, and 8 glass pieces were aligned in two lines without gap to make a 4 cm wide and 8 cm long strip with their adhesive tape-stuck edges making both sides (8 cm long) of the strip as spacers. The coating weight of the titanium dioxide particles was adjusted to 20 g/m². After coating, the adhesive tape was removed. The coating layer was air-dried at room temperature for one day and then calcined in an electric muffle furnace (Model FP-32, manufactured by Yamato Kagaku) at 450° C. for 30 minutes. After being cooled out of the furnace, the coated glass substrates were immersed in an ethanol solution of $3 \times 10^{-4}$ mol/l of the dye shown in Table 1 below for 3 hours. The dyed glass substrates were then immersed in 4-t-butylpyridine for 15 minutes, washed with ethanol, and dried spontaneously. The photosensitive layer (dye-sensitized $TiO_2$ layer) thus formed had a thickness of 10 μm and contained particulate semiconductor particles in an amount of 20 g/m². The amount of the dye adsorbed was selected from the range of 0.1 to 10 mmol/m² according to the kind of the dye.

(3) Preparation of photo-electrochemical cell

A solution of an electrolyte was prepared by dissolving F-2 (liquid crystal compound (I)) or a comparative compound RE-1 or RE-2 shown below in an equal weight of acetonitrile and adding 2 mol % of iodine. The solution was applied on the dye-sensitized $TiO_2$ electrode substrate (2 cm×2 cm) and let to penetrate into the electrode while evaporating acetonitrile. A Pt-deposited glass substrate of the same size was brought into contact with the $TiO_2$ electrode layer to prepare a photo-electrochemical cell shown in FIG. 1, which comprised a conductive glass substrate (glass 1 having conductor layer 2), $TiO_2$ electrode 3, dye layer 4, electrolyte (i.e., electrolytic solution) layer 5, platinum layer 6, and glass (substrate) 7 in this order. The resulting cells were designated sample 104, 102 and 103, respectively.

Sample 101 in which an electrolyte (i.e., an electrolytic solution) Z-1 (prepared by dissolving $(C_4H_9)_4NI$ in an equal weight of solvent S-5 and adding 2 mol % of iodine) was used was prepared by bringing the dye-sensitized $TiO_2$ electrode prepared in (2) above and a Pt-deposited glass substrate of the same size into contact with the $TiO_2$ electrode layer and the Pt deposit layer facing each other and penetrating the electrolytic solution Z-1 into the gap between the two glass substrates by making use of capillarity.

Samples 105 to 106 were prepared in the same manner as for sample 104, except for changing the combination of the dye and the electrolyte composition as shown in Table 1. Comparative Electrolyte:

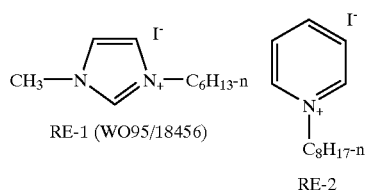

RE-1 (WO95/18456)

RE-2

TABLE 1

| Sample No. | Dye | Electrolyte | Electrolyte Compound | Alkali Metal Salt (molar eq.*) | Remark |
|---|---|---|---|---|---|
| 101 | R-1 | Z-1 | $(C_4H_9)_4NI$ | — | comparison |
| 102 | R-1 | Z-2 | RE-1 | — | " |
| 103 | R-1 | Z-3 | RE-2 | — | " |
| 104 | R-1 | Z-4 | F-2 | — | invention |
| 105 | R-1 | Z-5 | F-4 | — | " |
| 106 | R-1 | Z-6 | F-4 | LiI (1.0) | " |
| 107 | R-1 | Z-7 | F-4 | $LiN(SO_2CF_3)_2$ (1.0) | " |
| 108 | R-1 | Z-8 | F-6 | — | " |
| 109 | R-1 | Z-9 | F-6 | LiI (1.0) | " |
| 110 | R-1 | Z-10 | F-6 | $LiN(SO_2CF_3)_2$ (1.0) | " |
| 111 | R-1 | Z-11 | F-7 | — | " |
| 112 | R-1 | Z-12 | F-7 | LiI (1.0) | " |
| 113 | R-1 | Z-13 | F-7 | $LiN(SO_2CF_3)_2$ (1.0) | " |
| 114 | (1) | Z-8 | F-6 | — | " |
| 115 | (5) | Z-8 | F-6 | — | " |
| 116 | (29) | Z-8 | F-6 | — | " |
| 117 | (32) | Z-8 | F-6 | — | " |
| 118 | (37) | Z-8 | F-6 | — | " |
| 119 | (40) | Z-8 | F-6 | — | " |
| 120 | (43) | Z-8 | F-6 | — | " |
| 121 | R-1 | Z-14 | F-9 | — | " |
| 122 | R-1 | Z-15 | F-13 | — | " |
| 123 | R-1 | Z-16 | F-14 | — | " |
| 124 | R-1 | Z-17 | F-16 | — | " |
| 125 | R-1 | Z-18 | F-17 | — | " |
| 126 | R-1 | Z-19 | F-4/F-8** | — | " |
| 127 | R-1 | Z-20 | F-51 | — | " |
| 128 | R-1 | Z-21 | F-51 | LiI (1.0) | " |
| 129 | R-1 | Z-22 | F-51 | $LIN(SO_2CF_3)_2$ | " |
| 130 | R-1 | Z-23 | F-54 | — | " |
| 131 | R-1 | Z-24 | F-54 | LiI (1.0) | " |
| 132 | R-1 | Z-25 | F-54 | $LIN(SO_2CF_3)_2$ | " |

Note:
*Molar equivalent to the iodine salt
**F-4/F-8 = 50/50 by mole (4) Evaluation of photoelectric characteristics The photoelectric characteristics of the photo-electrochemical cells 101 to 126 were evaluated as follows.

The conductive glass and the Pt-deposited glass were connected by means of alligator clips, and the cell was irradiated with pseudo-sunlight containing no ultraviolet rays and having an intensity of 50 mW/cm² which was obtained by cutting light from a 500 W xenon lamp (produced by Ushio Inc.) through AM1.5 Filter (produced by Oriel Corp.) and a sharp cut filter (Kenko L-42). The generated electricity was measured with a Keithley electrometer (Model SMU238) to obtain an open circuit voltage ($V_{OC}$), a short circuit current density ($J_{SC}$), a fill factor (FF) (=maximum output/(open circuit voltage×short circuit current density)), and a conversion efficiency (η). After 600-hour continuous irradiation, the short circuit current density was again measured to obtain a reduction. The results obtained are shown in Table 2 below.

TABLE 2

| Sample No. | $J_{sc}$ (mA/cm²) | $V_{oc}$ (V) | FF | η (%) | $J_{sc}$ Reduction after 600 hrs (%) |
|---|---|---|---|---|---|
| 101 | 3.13 | 0.45 | 0.45 | 1.27 | 95 |
| 102 | 3.40 | 0.59 | 0.55 | 2.21 | 35 |
| 103 | 3.29 | 0.53 | 0.51 | 1.78 | 42 |
| 104 | 5.10 | 0.60 | 0.61 | 3.37 | 12 |
| 105 | 6.21 | 0.59 | 0.59 | 4.32 | 11 |
| 106 | 7.33 | 0.57 | 0.58 | 4.85 | 9 |
| 107 | 7.51 | 0.58 | 0.58 | 5.05 | 8 |
| 108 | 6.93 | 0.60 | 0.59 | 4.91 | 8 |
| 109 | 6.99 | 0.62 | 0.60 | 5.20 | 10 |
| 110 | 7.05 | 0.62 | 0.61 | 5.33 | 9 |
| 111 | 5.89 | 0.59 | 0.62 | 4.31 | 10 |
| 112 | 6.21 | 0.58 | 0.62 | 4.47 | 13 |
| 113 | 6.35 | 0.59 | 0.63 | 4.72 | 7 |
| 114 | 6.09 | 0.60 | 0.59 | 4.31 | 11 |
| 115 | 5.91 | 0.58 | 0.58 | 3.98 | 13 |
| 116 | 5.32 | 0.59 | 0.57 | 3.58 | 9 |
| 117 | 5.25 | 0.55 | 0.60 | 3.47 | 15 |
| 118 | 5.48 | 0.59 | 0.59 | 3.82 | 14 |
| 119 | 5.77 | 0.48 | 0.61 | 3.38 | 18 |
| 120 | 5.69 | 0.49 | 0.58 | 3.23 | 11 |
| 121 | 4.81 | 0.57 | 0.55 | 3.02 | 16 |
| 122 | 4.97 | 0.55 | 0.57 | 3.12 | 12 |
| 123 | 3.99 | 0.58 | 0.58 | 2.68 | 10 |
| 124 | 4.35 | 0.57 | 0.56 | 2.78 | 18 |
| 125 | 4.44 | 0.52 | 0.57 | 2.63 | 17 |
| 126 | 6.51 | 0.60 | 0.59 | 4.61 | 11 |
| 127 | 5.98 | 0.57 | 0.61 | 4.16 | 12 |
| 128 | 6.23 | 0.57 | 0.58 | 4.12 | 10 |
| 129 | 6.33 | 0.56 | 0.57 | 4.04 | 11 |
| 130 | 5.86 | 0.59 | 0.59 | 4.08 | 13 |
| 131 | 6.12 | 0.58 | 0.58 | 4.11 | 12 |
| 132 | 6.28 | 0.56 | 0.58 | 4.08 | 12 |

(Sample Nos. 101 to 103 are comparative samples and Sample Nos. 104 to 126 are samples of the present invention.)

It is clearly seen from the results in Table 2 that sample 101 containing a solvent and very poor transporting layer has low initial performance and very poor durability due to volatilization of the solvent. Samples 102 and 103 using comparative electrolyte RE-1 and RE-2, respectively, show somewhat improved durability but are inferior in initial performance. In contrast, samples using the compound (I) as an electrolyte are superior in not only initial performance (i.e., short circuit current density, conversion efficiency, etc.) but also durability. The improvements on initial performance and durability of the performance are observed irrespective of the kind of the sensitizing dyes. It is also recognized that addition of an alkali metal salt brings about better results.

While the invention has been described in detail and with reference to specific examples thereof, it will be apparent to one skilled in the art that various changes and modifications can be made therein without departing from the spirit and scope thereof.

What is claimed is:

1. A liquid crystal compound represented by formula (I-1) or (I-2):

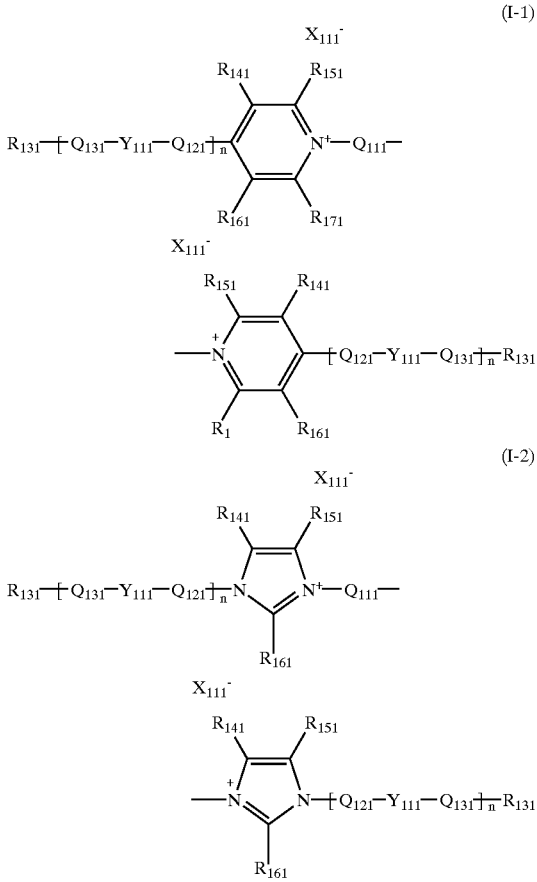

wherein $Q_{111}$ represents a divalent linking group with the proviso that $Q_{111}$ does not represent a polymethylene group nor a phenylenebis(poly)methylene group without containing a hetero atom; $X_{111}^-$ represents an anion; $R_{141}$, $R_{151}$, $R_{161}$, and $R_{171}$ each represent a hydrogen atom or a substituent; $R_{131}$ represents a substituted or unsubstituted alkyl group or a substituted or unsubstituted alkenyl group; $Y_{111}$ represents a divalent 4-, 5-, 6- or 7-membered ring or a divalent condensed ring composed of their rings; $Q_{121}$ and $Q_{131}$ each represent a divalent linking group or a single bond; n represents 1, 2 or 3; when n is 2 or 3, the plural $Y_{111}$'s, $Q_{121}$'s, and $Q_{131}$'s may be the same or different.

2. The liquid crystal compound as in claim 1, wherein $X_{111}^-$ is an iodide anion.

3. The liquid crystal compound as in claim 1, wherein $Q_{111}$ is represented by formula (II):

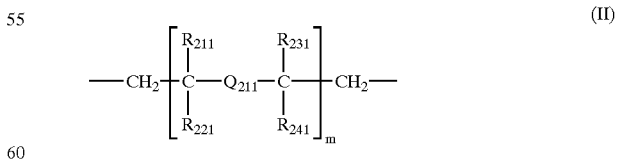

wherein $Q_{211}$ represents a divalent linking group except a methylene group; $R_{211}$, $R_{221}$, $R_{231}$, and $R_{241}$ each represents a hydrogen atom or a substituent and may be connected to $Q_{211}$ to form a ring; and m represents 0 or 1, provided that formula (II) does not represent a polymethylene group without containing a hetero atom.

4. The liquid crystal compound as in claim 1, wherein $Q_{111}$ is represented by formula (III):

(III)

wherein p represents an integer of 1 to 30.

5. A liquid crystal mixture comprising at least two liquid crystal compounds represented by formula (I-1) or (I-2):

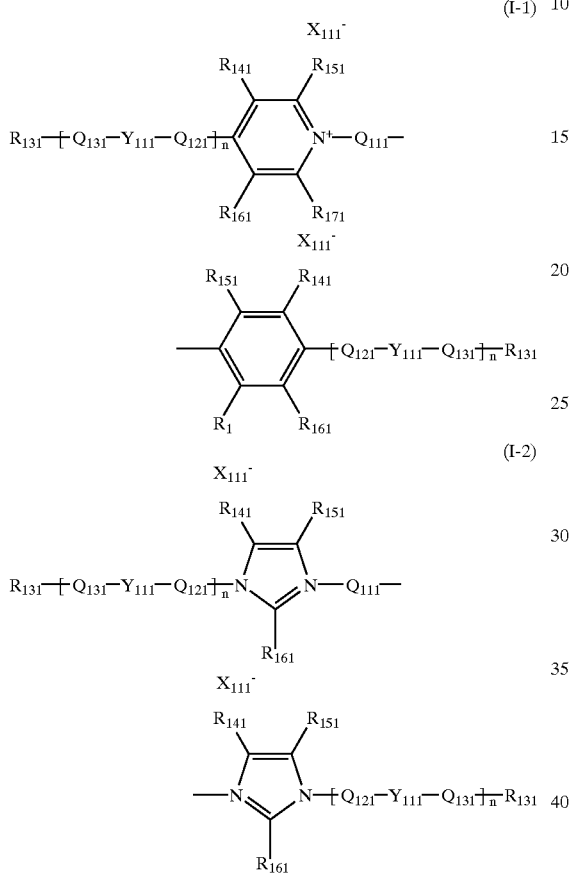

wherein $Q_{111}$ represents a divalent linking group with the proviso that $Q_{111}$ does not represent a polymethylene group nor a phenylenebis(poly)methylene group without containing a hetero atom; $X_{111}^-$ represents an anion; $R_{141}$, $R_{151}$, $R_{161}$, and $R_{171}$ each represent a hydrogen atom or a substituent; $R_{131}$ represents a substituted or unsubstituted alkyl group or a substituted or unsubstituted alkenyl group; $Y_{111}$ represents a divalent 4-, 5-, 6- or 7-membered ring or a divalent condensed ring composed of their rings; $Q_{121}$ and $Q_{131}$ each represent a divalent linking group or a single bond; n represents 1, 2 or 3; when n is 2 or 3, the plural $Y_{111}$'s, $Q_{121}$'s, and $Q_{131}$'s may be the same or different.

6. The liquid crystal mixture as in claim 5, wherein said at least two liquid crystal compounds have $Q_{111}$ represented by formula (III):

(III)

wherein p represents an integer of 1 to 30, and are different from each other in p number.

7. A liquid crystal composition comprising at least one liquid crystal compound represented by formula (I-1) or (I-2):

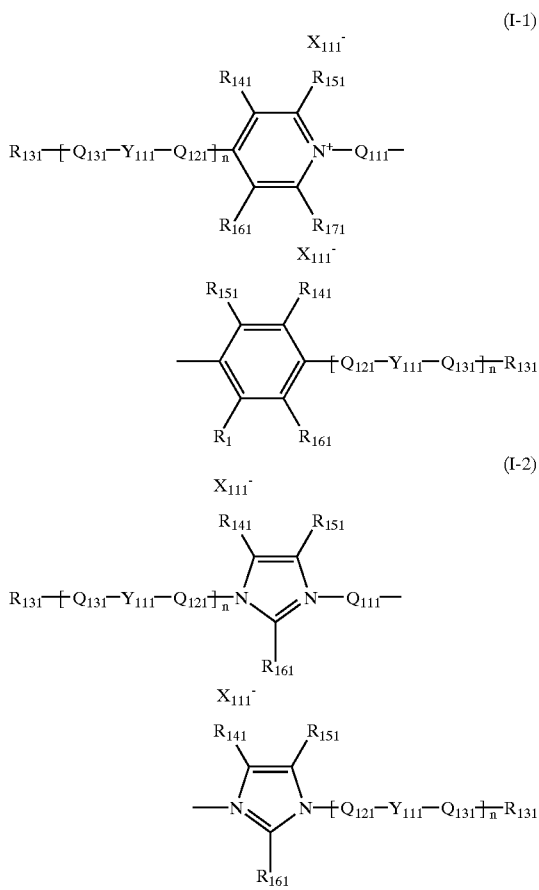

wherein $Q_{111}$ represents a divalent linking group with the proviso that $Q_{111}$ does not represent a polymethylene group nor a phenylenebis(poly)methylene group without containing a hetero atom; $X_{111}^-$ represents an anion; $R_{141}$, $R_{151}$, $R_{161}$, and $R_{171}$ each represent a hydrogen atom or a substituent; $R_{131}$ represents a substituted or unsubstituted alkyl group or a substituted or unsubstituted alkenyl group; $Y_{111}$ represents a divalent 4-, 5-, 6- or 7-membered ring or a divalent condensed ring composed of their rings; $Q_{121}$ and $Q_{131}$ each represent a divalent linking group or a single bond; n represents 1, 2 or 3; when n is 2 or 3, the plural $Y_{111}$'s, $Q_{121}$'s, and $Q_{131}$'s may be the same or different, and at least one compound selected from an alkali metal salt and an alkaline earth metal salt.

8. An electrolyte containing at least one liquid crystal compound represented by formula (IA):

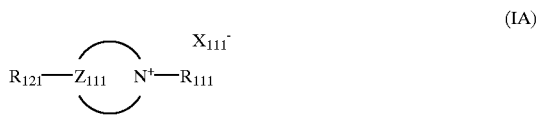
(IA)

wherein $R_{111}$ represents a substituted or unsubstituted alkyl or alkenyl group which is bonded to the nitrogen either directly or via a divalent linking group; $Z_{111}$ represents an atomic group necessary to form a 5- or 6-membered aromatic heterocyclic cation together with the nitrogen atom; $R_{121}$ represents a substituent serving to exhibit liquid crystal properties which contains at least one divalent cyclic linking group and at least one substituted or unsubstituted alkyl or alkenyl group; and $X_{111}^-$ represents an anion.

9. The electrolyte as in claim 8, wherein said substituent serving to exhibit liquid crystal properties as represented by $R_{121}$ is represented by formula (IB):

wherein $R_{122}$ represents a substituted or unsubstituted alkyl or alkenyl group; $Y_{111}$ represents a divalent 4- to 7-membered cyclic group or a divalent condensed cyclic group composed of a 4- to 7-membered rings; $Q_{121}$ and $Q_{131}$ each represent a divalent linking group or a single bond; n represents 1, 2 or 3; when n is 2 or 3, the plural $Y_{111}$'s, $Q_{121}$'s, and $Q_{131}$'s may be the same or different.

10. The electrolyte as in claim 8, wherein said aromatic heterocyclic cation completed by $Z_{111}$ is a pyridinium or an imidazolium.

11. The electrolyte as in claim 8, wherein said liquid crystal compound represented by formula (IA) is a liquid crystal compound represented by formula (I-1) or (I-2):

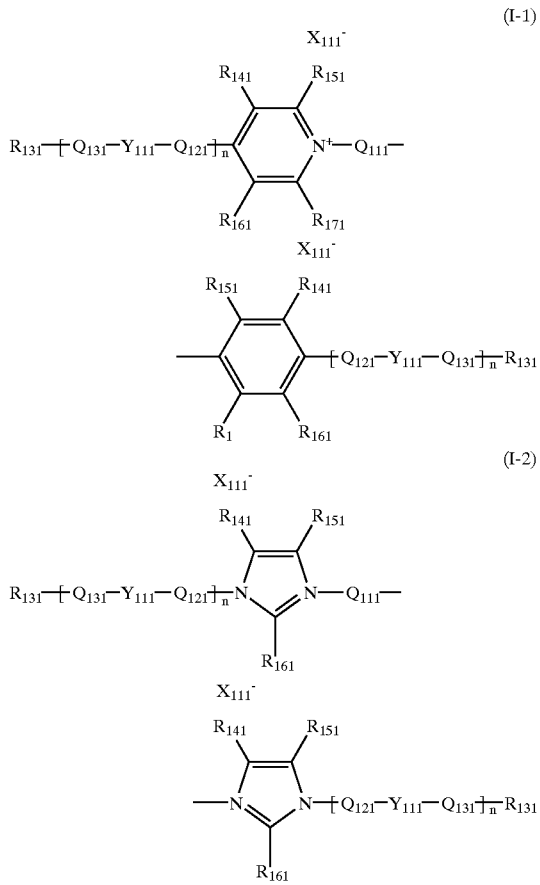

wherein $Q_{111}$ represents a divalent linking group with the proviso that $Q_{111}$ does not represent a polymethylene group nor a phenylenebis(poly)methylene group without containing a hetero atom; $X_{111}^-$ represents an anion; $R_{141}$, $R_{151}$, $R_{161}$, and $R_{171}$ each represent a hydrogen atom or a substituent; $R_{131}$ represents a substituted or unsubstituted alkyl group or a substituted or unsubstituted alkenyl group; $Y_{111}$ represents a divalent 4-, 5-, 6- or 7-membered ring or a divalent condensed ring composed of their rings; $Q_{121}$ and $Q_{131}$ each represent a divalent linking group or a single bond; n represents 1, 2 or 3; when n is 2 or 3, the plural $Y_{111}$'s, $Q_{121}$'s, and $Q_{131}$'s may be the same or different.

12. The electrolyte as in claim 8, which further contains iodine.

13. An electrochemical cell having an electrolyte containing at least one liquid crystal compound represented by formula (IA):

wherein $R_{111}$ represents a substituted or unsubstituted alkyl or alkenyl group which is bonded to the nitrogen either directly or via a divalent linking group; $Z_{111}$ represents an atomic group necessary to form a 5- or 6-membered aromatic heterocyclic cation together with the nitrogen atom; $R_{121}$ represents a substituent serving to exhibit liquid crystal properties which contains at least one divalent cyclic linking group and at least one substituted or unsubstituted alkyl or alkenyl group; and $X_{111}^-$ represents an anion.

14. A photo-electrochemical cell which comprises a charge transporting layer comprising an electrolyte and a semiconductor responsive to a radiant ray, wherein said electrolyte contains at least one liquid crystal compound represented by formula (IA):

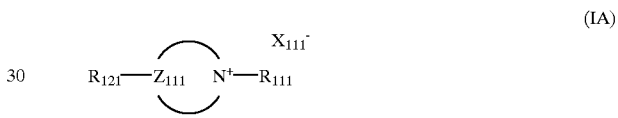

wherein $R_{111}$ represents a substituted or unsubstituted alkyl or alkenyl group which is bonded to the nitrogen either directly or via a divalent linking group; $Z_{111}$ represents an atomic group necessary to form a 5- or 6-membered aromatic heterocyclic cation together with the nitrogen atom; $R_{121}$ represents a substituent serving to exhibit liquid crystal properties which contains at least one divalent cyclic linking group and at least one substituted or unsubstituted alkyl or alkenyl group; and $X_{111}^-$ represents an anion.

15. The photo-electrochemical cell as in claim 14, wherein said semiconductor is a particulate semiconductor sensitized with a dye.

16. An electrolyte containing at least one liquid crystal compound represented by formula (IA):

wherein $R_{111}$ represents a substituted or unsubstituted alkyl or alkenyl group which is bonded to the nitrogen either directly or via a divalent linking group; $Z_{111}$ represents an atomic group necessary to form a 5- or 6-membered aromatic heterocyclic cation together with the nitrogen atom; $R_{121}$ represents a substituent serving to exhibit liquid crystal properties and is represented by formula (IB):

wherein $R_{122}$ represents a substituted or unsubstituted alkyl or alkenyl group; $Y_{111}$ represents a divalent 4- to 7-membered cyclic group or divalent condensed cyclic group composed of 4- to 7-membered rings; $Q_{121}$ and $Q_{131}$ each represent a divalent linking group or a single bond; n represents 1, 2 or 3; when n is 2 or 3, the plural $Y_{111}$'s, $Q_{121}$'s, and $Q_{131}$'s may be the same or different; and $X_{111}{}^-$ represents an anion:

with the proviso that when $R_{111}$ is an unsubstituted alkyl and $Z_{111}$ and the nitrogen atom form a pyridinium cation, then $Q_{121}$ is not —CO—.

17. An electrochemical cell having an electrolyte containing at least one liquid crystal compound represented by formula (IA):

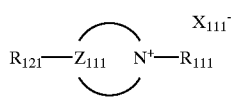  (IA)

wherein $R_{111}$ represents a substituted or unsubstituted alkyl or alkenyl group which is bonded to the nitrogen either directly or via a divalent linking group; $Z_{111}$ represents an atomic group necessary to form a 5- or 6-membered aromatic heterocyclic cation together with the nitrogen atom; $R_{121}$ represents a substituent serving to exhibit liquid crystal properties and is represented by formula (IB):

  (IB)

wherein $R_{122}$ represents a substituted or unsubstituted alkyl or alkenyl group; $Y_{111}$ represents a divalent 4- to 7-membered cyclic group or divalent condensed cyclic group composed of 4- to 7-membered rings; $Q_{121}$ and $Q_{131}$ each represent a divalent linking group or a single bond; n represents 1, 2 or 3; when n is 2 or 3, the plural $Y_{111}$'s, $Q_{121}$'s, and $Q_{131}$'s may be the same or different; and $X_{111}{}^-$ represents an anion:

with the proviso that when $R_{111}$ is an unsubstituted alkyl and $Z_{111}$ and the nitrogen atom form a pyridinium cation, then $Q_{121}$ is not —CO—.

18. A photo-electrochemical cell which comprises a charge transporting layer comprising an electrolyte and a semiconductor responsive to a radiant ray, wherein said electrolyte contains at least one liquid crystal compound represented by formula (IA):

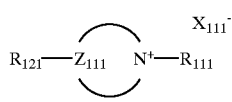  (IA)

wherein $R_{111}$ represents a substituted or unsubstituted alkyl or alkenyl group which is bonded to the nitrogen either directly or via a divalent linking group; $Z_{111}$ represents an atomic group necessary to form a 5- or 6-membered aromatic heterocyclic cation together with the nitrogen atom; $R_{121}$ represents a substituent serving to exhibit liquid crystal properties and is represented by formula (IB):

  (IB)

wherein $R_{122}$ represents a substituted or unsubstituted alkyl or alkenyl group; $Y_{111}$ represents a divalent 4- to 7-membered cyclic group or divalent condensed cyclic group composed of 4- to 7-membered rings; $Q_{121}$ and $Q_{131}$ each represent a divalent linking group or a single bond; n represents 1, 2 or 3; when n is 2 or 3, the plural $Y_{111}$'s, $Q_{121}$'s, and $Q_{131}$'s may be the same or different; and $X_{111}{}^-$ represents an anion:

with the proviso that when $R_{111}$ is an unsubstituted alkyl and $Z_{111}$ and the nitrogen atom form a pyridinium cation, then $Q_{121}$ is not —CO—.

19. The electrolyte as in claim 9, wherein $Q_{121}$ is selected from the group consisting of —CH=CH—, —CH=N—, —N=N—, —NO=N—, —COO—, —COS—, —CONH—, —COCH$_2$—, —CH$_2$CH$_2$—, —OCH$_2$—, —CH$_2$NH—, —CH$_2$—, —O—, —S—, —NH—, —(CH$_2$)$_n$— wherein n is 1, 2 or 3, —CH=CH—COO—, —CH=CH—CO—, —(C≡C)$_n$— wherein n is 1, 2 or 3, combinations thereof.

20. The electrochemical cell as claimed in claim 13, wherein $R_{121}$ represents a substituent serving to exhibit liquid crystal properties and is represented by formula (IB):

  (IB)

wherein $R_{122}$ represents a substituted or unsubstituted alkyl or alkenyl group; $Y_{111}$ represents a divalent 4- to 7-membered cyclic group or a divalent condensed cyclic group composed of 4- to 7-membered rings; $Q_{121}$ is selected from the group consisting of —CH=CH—, —CH=N—, —N=N—, —NO=N—, —COO—, —COS—, —CONH—, —COCH$_2$—, —CH$_2$CH$_2$—, —OCH$_2$—, —CH$_2$NH—, —CH$_2$—, —O—, —S—, —NH—, —(CH$_2$)$_x$— wherein x is 1, 2 or 3, —CH=CH—COO—, —CH=CH—CO—, —(C≡C)$_x$— wherein x is 1, 2 or 3, and combinations thereof; and $Q_{131}$ each represent a divalent linking group or a single bond; n represents 1, 2 or 3; when n is 2 or 3, the plural $Y_{111}$'s, $Q_{121}$'s, and $Q_{131}$'s may be the same or different; and $X_{111}{}^-$ represents an anion.

21. The photo-electrochemical cell as claimed in claim 14, wherein $R_{121}$ represents a substituent serving to exhibit liquid crystal properties and is represented by formula (IB):

  (IB)

wherein $R_{122}$ represents a substituted or unsubstituted alkyl or alkenyl group; $Y_{111}$ represents a divalent 4- to 7-membered cyclic group or a divalent condensed cyclic group composed of 4- to 7-membered rings; $Q_{121}$ is selected from the group consisting of —CH=CH—, —CH=N—, —N=N—, —NO=N—, —COO—, —COS—, —CONH—, —COCH$_2$—, —CH$_2$CH$_2$—, —OCH$_2$—, —CH$_2$NH—, —CH$_2$—, —O—, —S—, —NH—, —(CH$_2$)$_x$— wherein x is 1, 2 or 3, —CH=CH—COO—, —CH=CH—CO—, —(C≡C)$_x$— wherein x is 1, 2 or 3, and combinations thereof; and $Q_{131}$ each represent a divalent linking group or a single bond; n represents 1, 2 or 3; when n is 2 or 3, the plural $Y_{111}$'s, $Q_{121}$'s, and $Q_{131}$'s may be the same or different; and $X_{111}{}^-$ represents an anion.

22. The electrolyte as in claim 8, wherein the liquid crystal compound represented by formula (IA) is capable of forming a liquid crystal phase at room temperature.

* * * * *